(12) United States Patent
Kim et al.

(10) Patent No.: US 8,223,278 B2
(45) Date of Patent: Jul. 17, 2012

(54) DISPLAY DEVICE HAVING A TOUCH SCREEN PANEL

(75) Inventors: Seong-ho Kim, Yongin-si (KR); Dong-jin Jeong, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 317 days.

(21) Appl. No.: 11/936,253

(22) Filed: Nov. 7, 2007

(65) Prior Publication Data

US 2008/0151171 A1 Jun. 26, 2008

(30) Foreign Application Priority Data

Dec. 21, 2006 (KR) .......................... 10-2006-0131913

(51) Int. Cl.
*G02F 1/1335* (2006.01)
*G02F 1/1343* (2006.01)

(52) U.S. Cl. ........... 349/12; 349/150; 345/173; 345/176

(58) Field of Classification Search .................. 345/173, 345/176; 349/12, 16, 17, 149, 150
See application file for complete search history.

(56) References Cited

U.S. PATENT DOCUMENTS

| | | | | |
|---|---|---|---|---|
| 5,628,031 A * | 5/1997 | Kikinis et al. | | 710/73 |
| 2002/0101399 A1 * | 8/2002 | Kubo et al. | | 345/104 |
| 2002/0149571 A1 * | 10/2002 | Roberts | | 345/174 |
| 2002/0180712 A1 * | 12/2002 | Sato et al. | | 345/173 |
| 2004/0095334 A1 * | 5/2004 | Hong | | 345/173 |
| 2005/0195488 A1 * | 9/2005 | McCabe et al. | | 359/603 |
| 2006/0061716 A1 * | 3/2006 | Yamaguchi et al. | | 349/114 |
| 2006/0274055 A1 * | 12/2006 | Reynolds et al. | | 345/174 |
| 2006/0292851 A1 * | 12/2006 | Lin et al. | | 438/618 |
| 2007/0126690 A1 * | 6/2007 | Chae | | 345/102 |
| 2007/0128893 A1 * | 6/2007 | Wu et al. | | 439/74 |
| 2007/0246341 A1 * | 10/2007 | Kim et al. | | 200/5 A |

FOREIGN PATENT DOCUMENTS

| | | |
|---|---|---|
| CN | 1506724 | 6/2004 |
| CN | 1720499 | 1/2006 |
| JP | 10-011204 | 1/1998 |
| JP | 10-312244 | 11/1998 |

* cited by examiner

*Primary Examiner* — Brian M. Healy
*Assistant Examiner* — Mary El Shammaa
(74) *Attorney, Agent, or Firm* — F. Chau & Associates, LLC

(57) ABSTRACT

A display device includes a first substrate, a second substrate, pads, a first flexible circuit board, and a second flexible circuit board. The first substrate includes a first insulating substrate, a first resistance layer formed on the first insulating substrate, and first and second signal lines formed on the first insulating substrate. The second substrate faces the first substrate and includes a second insulating substrate, a second resistance layer formed on the second insulating substrate, and third and fourth signal lines formed on the second insulating substrate. The pads comprise a first pad connected to the first signal line, a second pad connected to the second signal line, a third pad connected to the third signal line, and a fourth pad connected to the fourth signal line. The first flexible circuit board is connected to two of the pads and the second flexible circuit board is connected to the other two pads.

14 Claims, 28 Drawing Sheets

DISPLAY DEVICE HAVING A TOUCH SCREEN PANEL

CROSS-REFERENCE TO RELATED APPLICATIONS

This application claims priority to Korean Patent Application No. 2006-0131913, filed on Dec. 21, 2006, in the Korean Intellectual Property Office, the disclosure of which is incorporated by reference herein.

BACKGROUND OF INVENTION

1. Technical Field

The present disclosure relates to a display device, and more particularly, to a display device having a touch screen panel.

2. Discussion of the Related Art

An image display device may include a cathode ray tube (CRT), a liquid crystal display (LCD), a plasma display panel (PDP), or an organic light emitting diode (OLED). The image display device may further include an input device such as a touch screen panel.

When a user presses a surface of the touch screen panel, for example, using a finger or a pen, information corresponding to a pressed position is transferred to the image display device and displayed.

The touch screen panel includes signal lines for sensing the pressed position. An electrical signal generated by the pressing may be output externally through a pad connected with a signal line.

However, pads can increase the size of the touch screen panel, thereby increasing the size of the display device. Thus, there is a need for a display device with a touch screen panel that has a reduced size.

SUMMARY OF THE INVENTION

An exemplary embodiment of the present invention provides a display device including a first substrate, a second substrate, pads, a first flexible circuit board, and a second flexible circuit board. The first substrate includes a first insulating substrate, a first resistance layer formed on the first insulating substrate, and first and second signal lines formed on the first insulating substrate. The second substrate faces the first substrate and includes a second insulating substrate, a second resistance layer formed on the second insulating substrate, and third and fourth signal lines formed on the second insulating substrate. The pads include a first pad connected to the first signal line, a second pad connected to the second signal line, a third pad connected to the third signal line, and a fourth pad connected to the fourth signal line. The first flexible circuit board is connected to two of the pads and the second flexible circuit board connected to the other two pads.

The first flexible circuit board and the second flexible circuit board may be connected to different corners of the first substrate, respectively.

The pads may be formed on the first substrate, and the display device may further include a conducting member which is formed between the first and second substrates and electrically connects the third pad with the third signal line and the fourth pad with the fourth signal line, respectively.

The first flexible circuit board may be connected to one of the first and second pads and to one of the third and fourth pads.

The first and second pads may be formed on the first substrate, the third and fourth pads may be formed on the second substrate, and the first and second flexible circuit boards may be provided as a double sided circuit board.

The display device may further include a liquid crystal panel placed in back of the first substrate.

The first insulating substrate may include glass, and the second insulating substrate may include a polymer film.

The liquid crystal panel may include a first liquid crystal panel substrate formed with a thin film transistor, a second liquid crystal panel substrate facing the first substrate and formed with a black matrix, and a liquid crystal layer positioned between the first and second liquid crystal panel substrates, wherein the pads are positioned within an area of the black matrix.

The display device may further include a liquid crystal panel substrate facing a rear surface of the first insulating substrate, and formed with a thin film transistor, and a liquid crystal layer positioned between the first insulating substrate and the liquid crystal panel substrate.

The display device may further include a black matrix formed on the rear surface of the first insulating substrate, wherein the pads are positioned within an area of the black matrix.

The display device may further include a first polarizing plate positioned on a rear surface of the liquid crystal panel substrate, and a second polarizing plate positioned on an upper surface of the liquid crystal panel substrate.

The second insulating substrate may include a polymer film.

An exemplary embodiment of the present invention provides a display device that includes a first substrate, a second substrate, pads, and a flexible circuit board. The first substrate includes a first insulating substrate, a first resistance layer formed on the first insulating substrate, and a plurality of X signal lines formed on the first insulating substrate. The second substrate faces the first substrate and includes a second insulating substrate, a second resistance layer formed on the second insulating substrate, and a plurality of Y signal lines formed on the second insulating substrate. The pads include a plurality of sub-pads electrically connected to one of the X signal lines and the Y signal lines, respectively. The flexible circuit board includes a flexible film, and a first input lead formed on a first surface of the flexible film and corresponding to a first set of the sub-pads.

The flexible circuit board may include a first flexible circuit board and a second flexible circuit board which are connected to different corners of the first substrate, respectively.

The flexible circuit board may include a second input lead formed on a second surface of the flexible film and corresponding to a second set of the sub-pads.

The first insulating substrate may include glass, the second insulating substrate may include a polymer film, and the pads may be formed on the first insulating substrate.

The sub-pads electrically connected to the X signal line may be formed on the first substrate, and the sub-pads electrically connected to the Y signal line may be formed on the second substrate.

The display device may further include a liquid crystal panel substrate facing a rear surface of the first insulating substrate and formed with a thin film transistor, and a liquid crystal layer positioned between the first insulating substrate and the liquid crystal panel substrate.

The display device may further include a black matrix formed on the rear surface of the first insulating substrate, wherein the pads are positioned within an area of the black matrix.

The display device may further include a first polarizing plate positioned on a rear surface of the liquid crystal panel substrate, and a second polarizing plate positioned on an upper surface of the second insulating substrate.

BRIEF DESCRIPTION OF THE DRAWINGS

The above and other aspects of the present invention will become more apparent by describing in detail exemplary embodiments thereof, with reference to the accompanying drawings, in which.

DETAILED DESCRIPTION OF EXEMPLARY EMBODIMENTS

Figure 1:
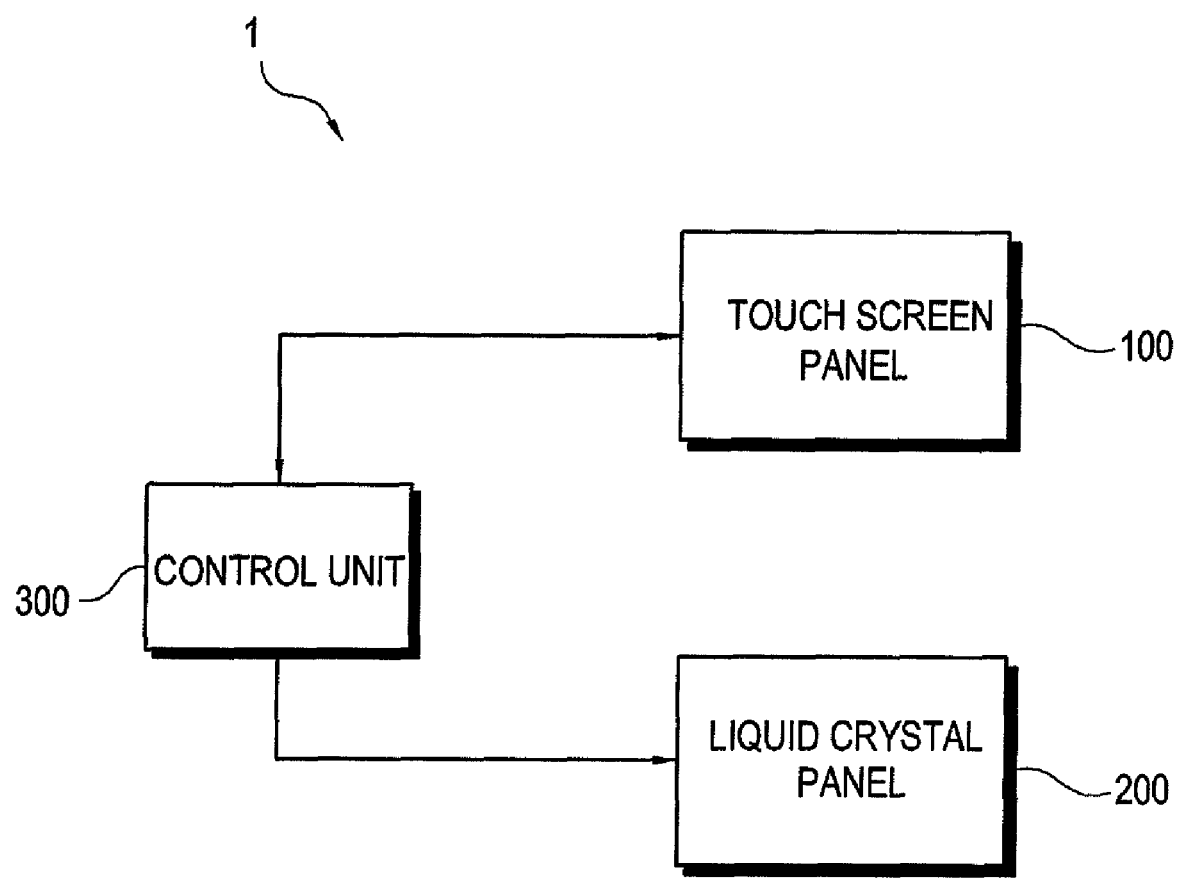
FIG. 1 is a high-level block diagram of a display device according to an exemplary embodiment of the present invention.

Hereinafter, exemplary embodiments of the present invention will now be described more fully with reference to the accompanying drawings. Like reference numerals may refer to like elements throughout the specification.

While the embodiments below illustrate, for example, that a display device includes a touch screen panel and a liquid crystal panel, the present invention is not limited to a liquid crystal panel, and may instead include, for example, an organic light emitting diode (OLED), a plasma display panel (PDP), or an electrophoresis display device.

Figure 2:
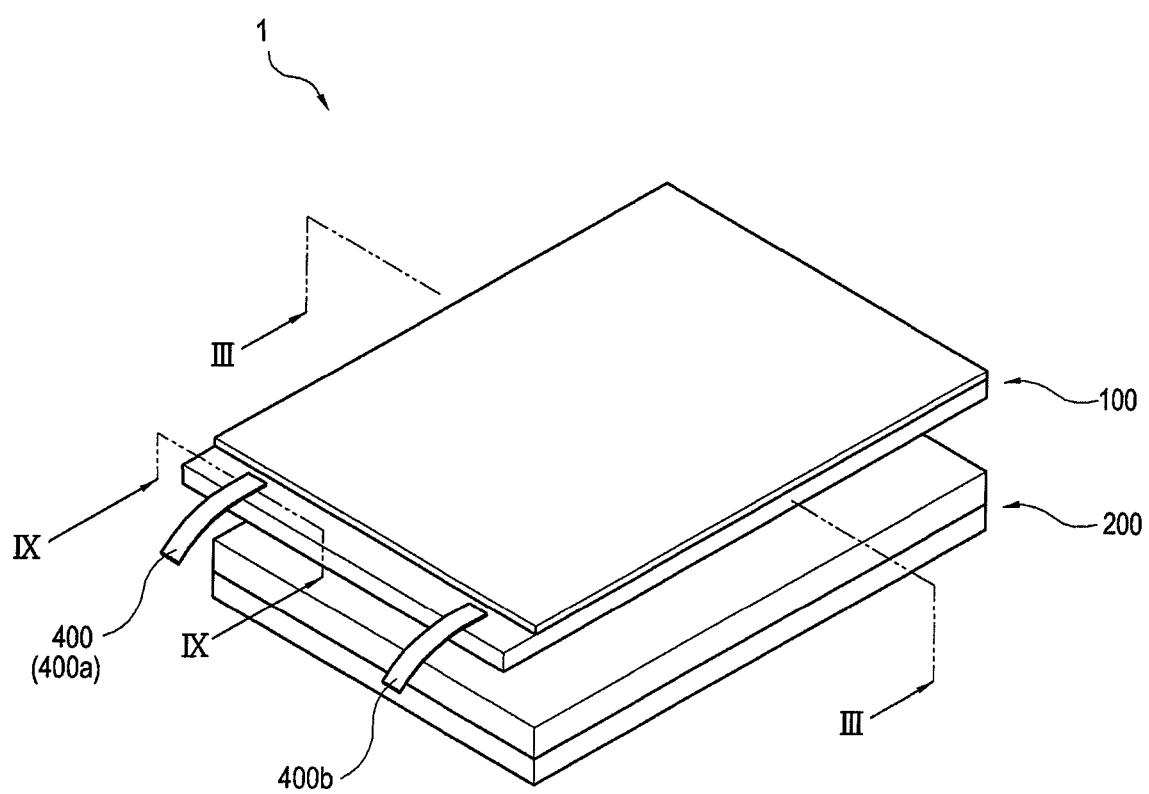
FIG. 2 is a perspective view of a display device, according to an exemplary embodiment of the present invention.

Referring to FIGS. 1 and 2, a display device 1 according to an exemplary embodiment of the present invention includes a touch screen panel 100, a liquid crystal panel 200, a control unit 300, and a flexible circuit board 400.

The touch screen panel 100 is positioned on the liquid crystal panel 200, and a side part of the touch screen panel 100 is connected with the flexible circuit board 400. The flexible circuit board 400 includes a first flexible circuit board 400a and a second flexible circuit board 400b.

When a user presses the touch screen panel 100, for example, using a finger or a pen, an electrical signal is generated by the pressing. The generated electrical signal is transferred to the control unit 300 through the flexible circuit board 400. The control unit 300 analyses the transferred electrical signal to calculate a coordinate of the pressed position, and displays information on the liquid crystal panel 200 according to the calculated coordinate.

Figure 3:
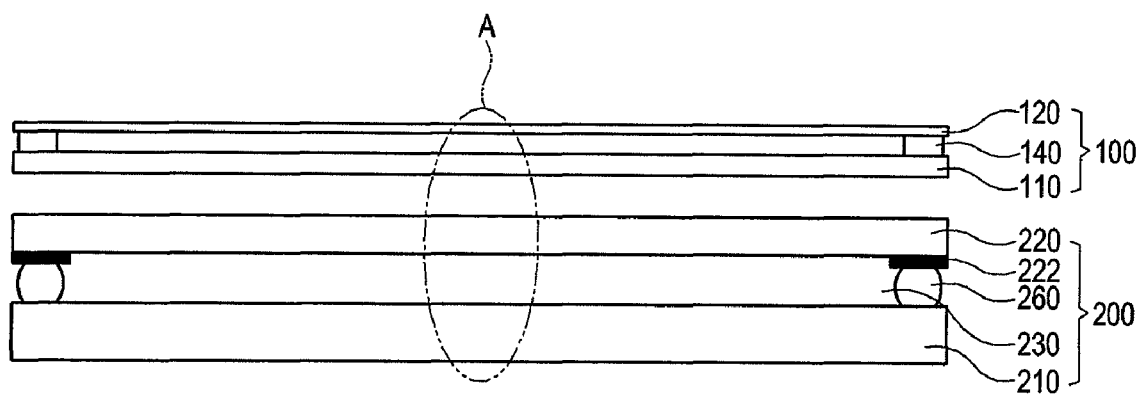
FIG. 3 is a cross sectional view, taken along line III-III of FIG. 2.

Referring to FIG. 3, the touch screen panel 100 includes a first substrate 110, a second substrate 120, and an adhesive layer 140 for bonding together both substrates 110 and 120.

The liquid crystal panel 200 includes a first liquid crystal panel substrate 210, a second liquid crystal panel substrate 220, a sealant 260 for bonding together both substrates 210 and 220, and a liquid crystal layer 230 positioned within a space enclosed by both the substrates 210 and 220, and the sealant 260. A first black matrix 222 is formed along the sealant 260 in the second liquid crystal panel 220.

Figure 4:
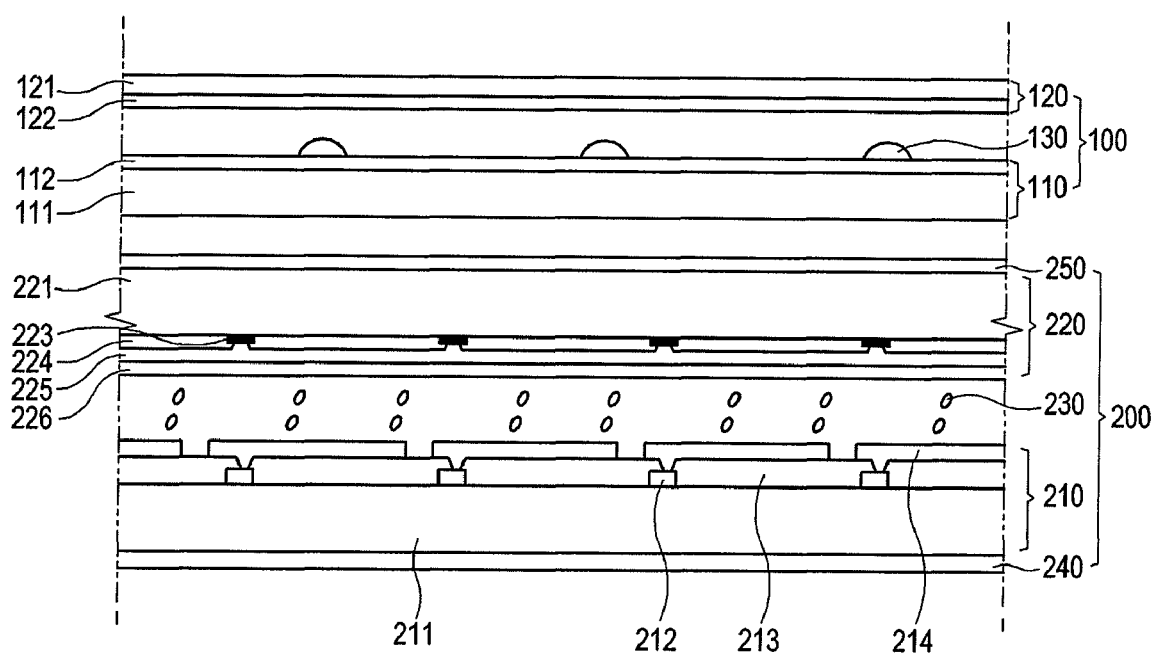
FIG. 4 is a magnified view of part A of FIG. 3.
Figure 5:
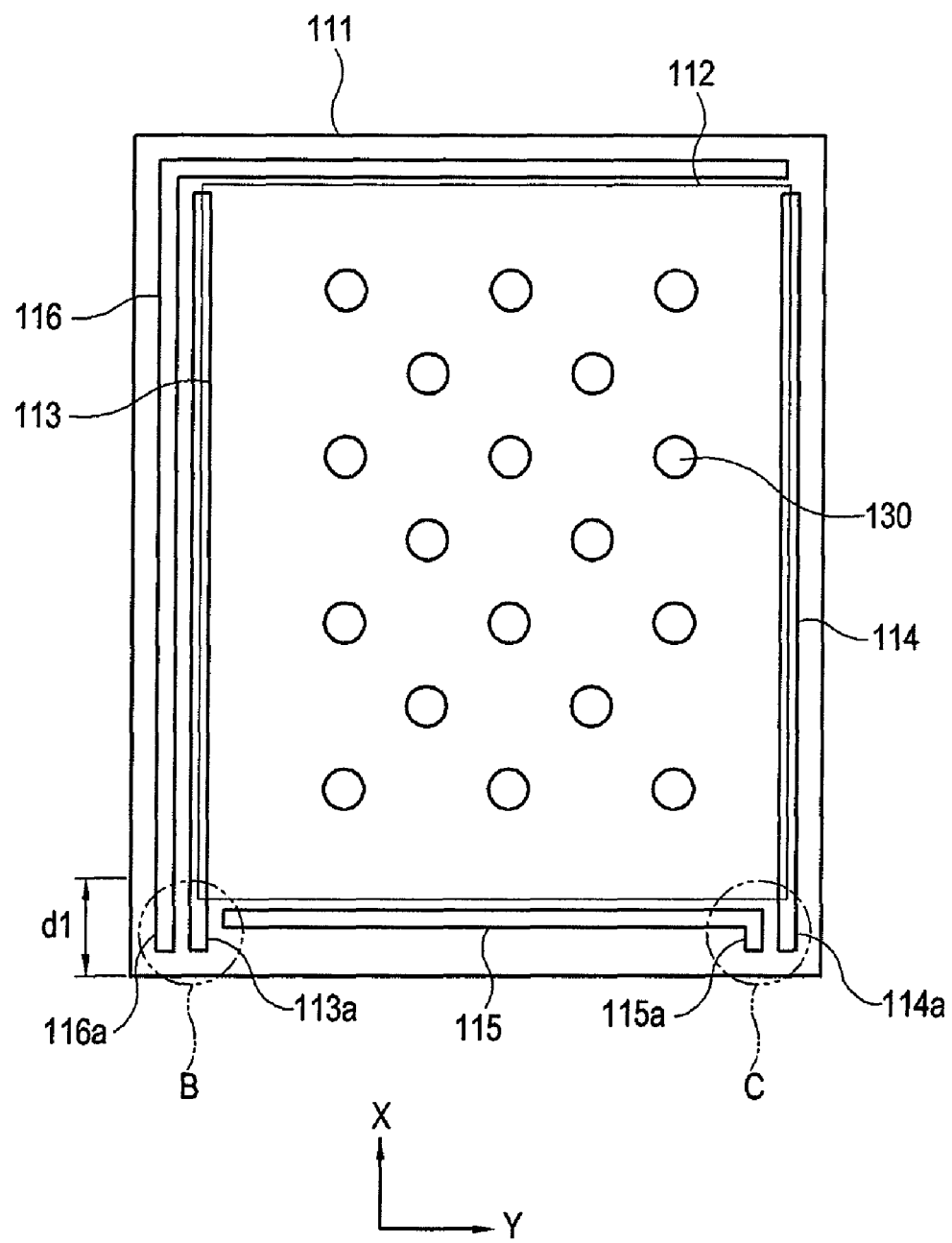
FIG. 5 is a plan view of a first substrate of the display device of FIG. 2, according to an exemplary embodiment of the present invention.

The touch screen panel 100 will be explained in detail with reference to FIGS. 4 through 7. Referring to FIGS. 4 and 5, the first substrate 110 includes a first insulating substrate 111, an resistance layer 112 formed on the first insulating substrate 111, a first signal line 113, a second signal line 114, a first connecting line 115, and a second connecting line 116.

The first insulating substrate 111 may have an almost rectangular shape, and can be made of glass. An area of the first insulating substrate 111 may be larger than the second insulating substrate 121. Pad areas B and C are disposed at a lower side of the first insulating substrate 111, which do not overlap with the second insulating substrate 121.

The first resistance layer 112 is formed substantially over an upper surface of the first insulating substrate 111, and may be made of a transparent conductive material, such as, for example, indium tin oxide (ITO) or indium zinc oxide (IZO).

The first signal line 113 and the second signal line 114 face each other across the first resistance layer 112 therebetween, and extend along a longitudinal length of the first insulating substrate 111. Since the first signal line 113 and the second signal line 114 extend in the X direction, they are referred to as X signal lines. The first signal line 113 and the second signal line 114 are electrically connected with each other, and may be made of metal.

An end portion of the first signal line 113 forms a first pad 113*a*, and the first pad 113*a* is not covered by the second substrate 120. An end portion of the second signal line 114 forms a second pad 114*a*, and the second pad 114*a* is not covered by the second substrate 120.

The first connecting line 115 is electrically connected with a third signal line 123 of the second substrate 120, and formed along a lower side of the first insulating substrate 111. The second connecting line 116 is electrically connected with a fourth signal line 124 of the second substrate 120, and formed along an upper left side of the first insulating substrate 111.

An end portion of the first connecting line 115, which is close to the second pad 114*a*, forms a third pad 115*a*, and the third pad 115*a* is not covered by the second substrate 120. An end portion of the second connecting line 116, which is close to the first pad 113*a*, forms a fourth pad 116*a*, and the fourth pad 116*a* is not covered by the second substrate 120.

The pads 113*a* through 116*a* may have an expanded width as compared to the connected signal lines 113 and 114 and the connecting lines 115 and 116. The pads 113*a* through 116*a* may be square shaped, with a length of about 1 mm.

The first pad 113*a* and the fourth pad 116*a* may be positioned within the first pad area B along the left bottom edge of the first insulating substrate 111. The second pad 114*a* and the third pad 115*a* may be positioned within the second pad area C along the right bottom edge of the first insulating substrate 111.

Figure 6:
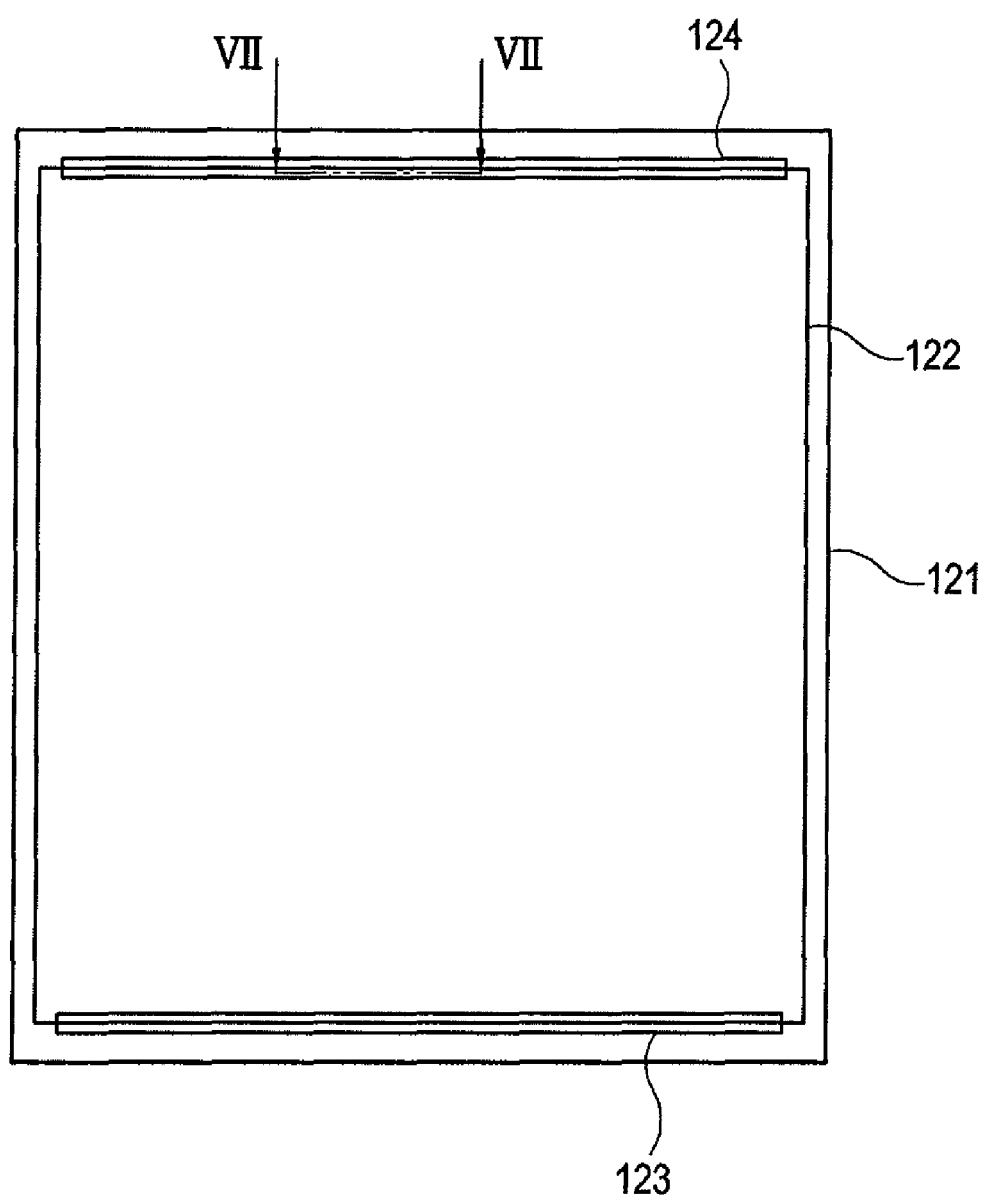
FIG. 6 is a plan view of a second substrate of the display device of FIG. 2, according to an exemplary embodiment of the present invention.

Referring to FIGS. 4 and 6, the second substrate 120 includes the second insulating substrate 121, a second resistance layer 122, the third signal line 123, and the fourth signal line 124 formed on the second insulating substrate 121.

The second insulating substrate 121 may be made of polymer film, and may have a shorter length than that of the first insulating substrate 111.

The second resistance layer 122 is formed substantially over the lower surface of the second insulating substrate 121, and may be made of a transparent conductive material, such as, for example, indium tin oxide (ITO) or indium zinc oxide (IZO).

The third signal line 123 and the fourth signal line 124 face each other across the second resistance layer 122 therebetween, and extend along a shorter length of the second insulating substrate 121. Since the third signal line 123 and the fourth signal line 124 extend in the Y direction, they are referred to as Y signal lines. The third signal line 123 and the fourth signal line 124 are electrically connected with each other, and may be made of metal.

Figure 7:
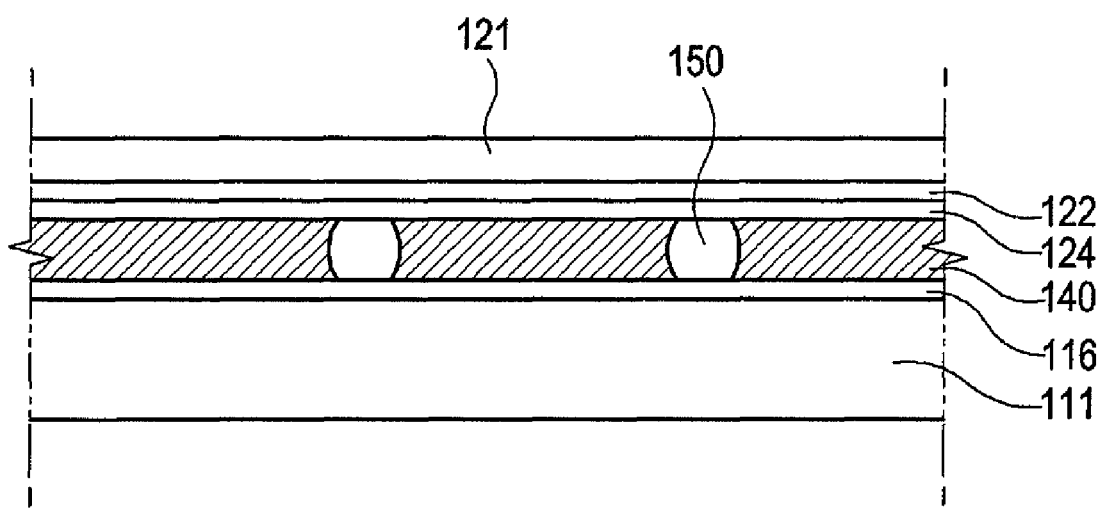
FIG. 7 is a cross sectional view, taken along line VII-VII of FIG. 6.

Referring to FIG. 7, the fourth signal line 124 is electrically connected to the second connecting line 116 through a conducting member 150, which may be made of metal. The conducting member 150 is discontinuously formed in the adhesive layer 140. The third signal line 123 is electrically connected to the first connecting line 115 in a similar manner.

Figure 8:
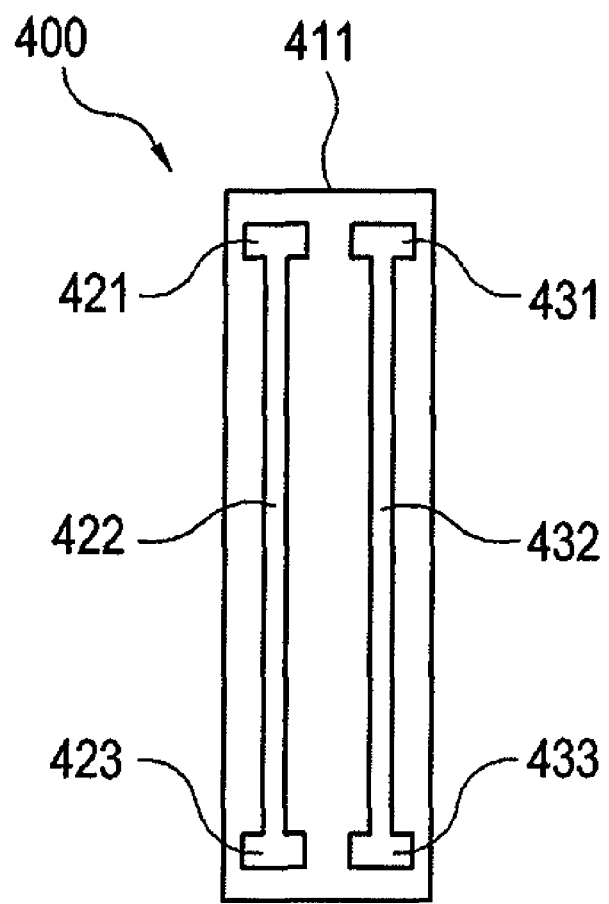
FIG. 8 is a front view of a flexible circuit board of the display device of FIG. 2, according to an exemplary embodiment of the present invention.

A connection between the pads 113*a* through 116*a* and the flexible circuit board 400 will be described below with reference to FIGS. 8 and 9. Referring to FIG. 8, the flexible circuit board 400 includes a flexible film 411, and a pair of connecting wires formed on the flexible circuit board 400.

A first connecting wire includes an input lead 421, an output lead 423, and a lead connecting portion 422 connecting both the leads 421 and 423. A second connecting wire includes an input lead 431, an output lead 433, and a lead connecting portion 432 connecting both the leads 431 and 433.

The first connecting wire and the second connecting wire are formed on a same surface of the flexible film 411. The input leads 421 and 431 are connected with the pads 113*a* through 116*a* of the first substrate 110, and the output leads 423 and 433 are electrically connected to the control unit 300.

The flexible circuit board 400 may further include an insulating film covering the lead connecting portions 422 and 432.

Figure 9:
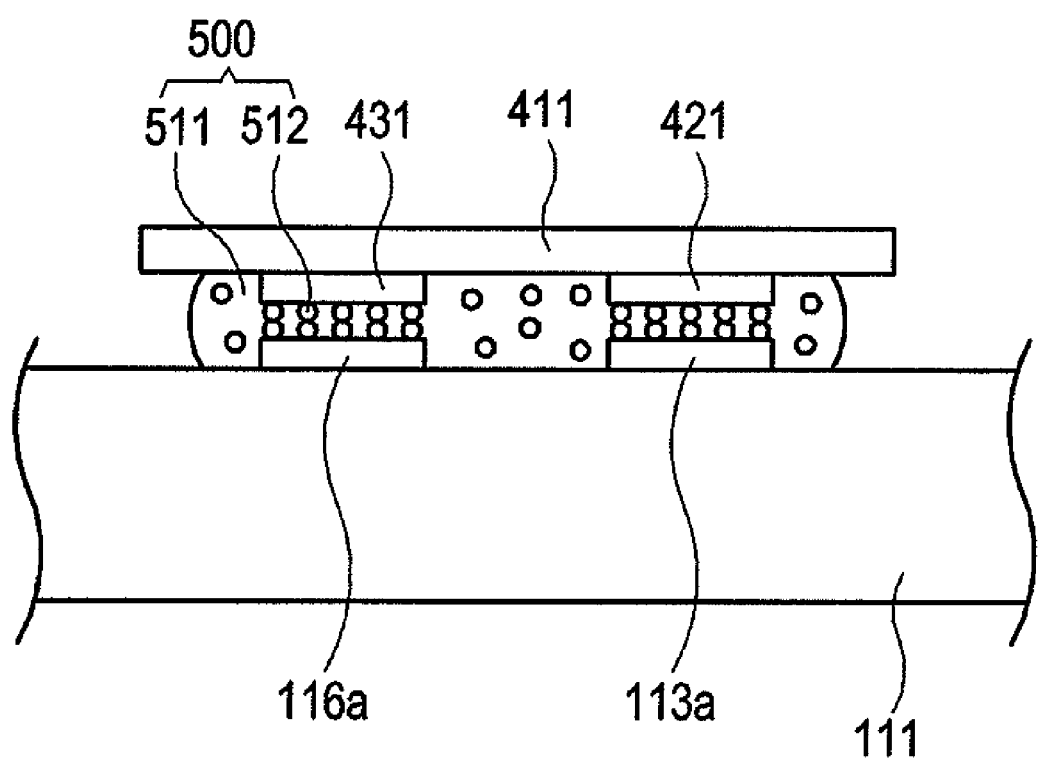
FIG. 9 is a cross sectional view, taken along line IX-IX of FIG. 2.

Referring to FIG. 9, the first pad 113*a* and the fourth pad 116*a* may be connected to the first flexible circuit board 400*a*. The first pad 113*a* is electrically connected to the input lead 421 of the first connecting wire through an anisotropic conducting film 500, and the fourth pad 116*a* is electrically connected to the input lead 431 of the second connecting wire through the anisotropic conducting film 500.

The anisotropic conducting film 500 includes a base resin part 511 and conductive balls 512 scattered in the base resin part 511. Between the pads 113*a* and 116*a* and the input leads 421 and 431, the conductive balls 512 forms an electrical channel by contacting with each other.

The second pad 114*a* and the third pad 115*a* may be connected to the second flexible circuit board 400*b* in a manner similar to the first pad 113*a* and the fourth pad 116*a*.

Spacers 130 are positioned on the first ohmic layer 112. The spacers 130 may have a hemispheric shape, and protect both resistance layers 112 and 122 from being short-circuited.

When the second insulating substrate 121 of the second substrate 120 is made of a polymer film, it is likely to be deformed towards the first substrate 110 due to gravity. If the second substrate 120 is deformed, both the resistance layers 112 and 122 may be shorted, thereby causing a problem in sensing the pressed position. The spacers 130 protect both resistance layers 112 and 122 from directly contacting with each other even if the second substrate 120 is deformed.

The spacers 130 may be formed by, for example, screen printing, printing using ultraviolet (UV) curing material or heat curing material.

The adhesive layer 140 is positioned along a perimeter of the touch screen panel 100 and bonds together both substrates 110 and 120. The adhesive layer 140 may be, for example, a double sided tape.

When the second substrate 120 is pressed, for example, using a pen or a finger to contact the first resistance layer 112 and the second resistance layer 122 with each other, a resistance value is changed according to the contacted position.

Depending on the changed resistance value, current or voltage is changed, and the changed current or voltage is outputted through the pads 113*a* through 116*a* and the flexible circuit board 400. The output leads 423 and 433 of the flexible circuit board 400 may be connected to the control unit 300 directly or a driving unit (not shown) of the liquid crystal panel 200.

The liquid crystal panel 200 will be further described with reference to FIGS. 2, 3 and 4.

The first liquid crystal panel substrate 210 includes a third insulating substrate 211, thin film transistors 212, an insulating film 213, and pixel electrodes 214.

The third insulating substrate 211 may be made of, for example, glass or plastic. Each of the pixel electrodes 214 are electrically connected to the respective thin film transistors 212.

The second liquid crystal panel substrate 220 may include a fourth insulating substrate 221, the first black matrix 222, a second black matrix 223, a color filter 224, an overcoat layer 225, and a common electrode 226.

The fourth insulating substrate 221 may be made of, for example, glass or plastic. The second black matrix 223 is formed to correspond to the thin film transistor 212. The color filter 224 includes a plurality of sub layers having different colors, for example, red, green, and blue. The common electrode 226 is formed across the fourth insulating substrate 221.

The pixel electrodes 214 and the common electrode 226 may be made of a transparent conductive material such as, for example, indium tin oxide (ITO) or indium zinc oxide (IZO).

An electric field is formed between the pixel electrodes 214 and the common electrode 226. The electric field adjusts an arrangement of LC molecules within the liquid crystal layer 230, thereby controlling the transmittance of light.

A first polarizing plate 240 is attached on an outer surface of the first liquid crystal panel substrate 210. A second polarizing plate 250 is attached on an outer surface of the second liquid crystal panel substrate 220.

The first polarizing plate 240 is attached to a rear surface of the third insulating substrate 211 of the first liquid crystal panel substrate 210 using an adhesive (not shown). The first polarizing plate 240 includes a polarizing layer controlling a polarization state of incident light and a supporting layer positioned on a top surface and a bottom surface of the polarizing layer.

The polarizing layer may be formed by heating a thin film of poly vinyl alcohol (PVA), extending the heated film, and depositing iodine on the extended film.

The supporting layer may be made of, for example, triacetyl cellulose (TAC). The supporting layer may be used to prevent the extruded polarizing layer from shrinking and to protect/support the polarizing layer.

Since the second polarizing plate 250 has a similar structure as the first polarizing plate 240, its description will be omitted.

The display device 1 may further include a backlight unit positioned in back of the liquid crystal panel 200.

The pads 113a through 116a of the touch screen panel 100 are divided into pairs and connected to the flexible circuit boards 400a and 400b.

Since each of the pad areas B and C are not complex, a width d1 needed for a pad area formation can be reduced, thereby reducing the size of the touch screen panel 100.

The pad areas B and C, the signal lines 113, 114, 123, and 124, and the connecting lines 115 and 116 may be positioned within the black matrix 222 area of the liquid crystal panel 200.

An arrangement of the signal lines 113 and 114 and the connecting lines 115 and 116 of the first substrate 110 may be changed in a variety of ways, as described in other embodiments.

Figure 10:
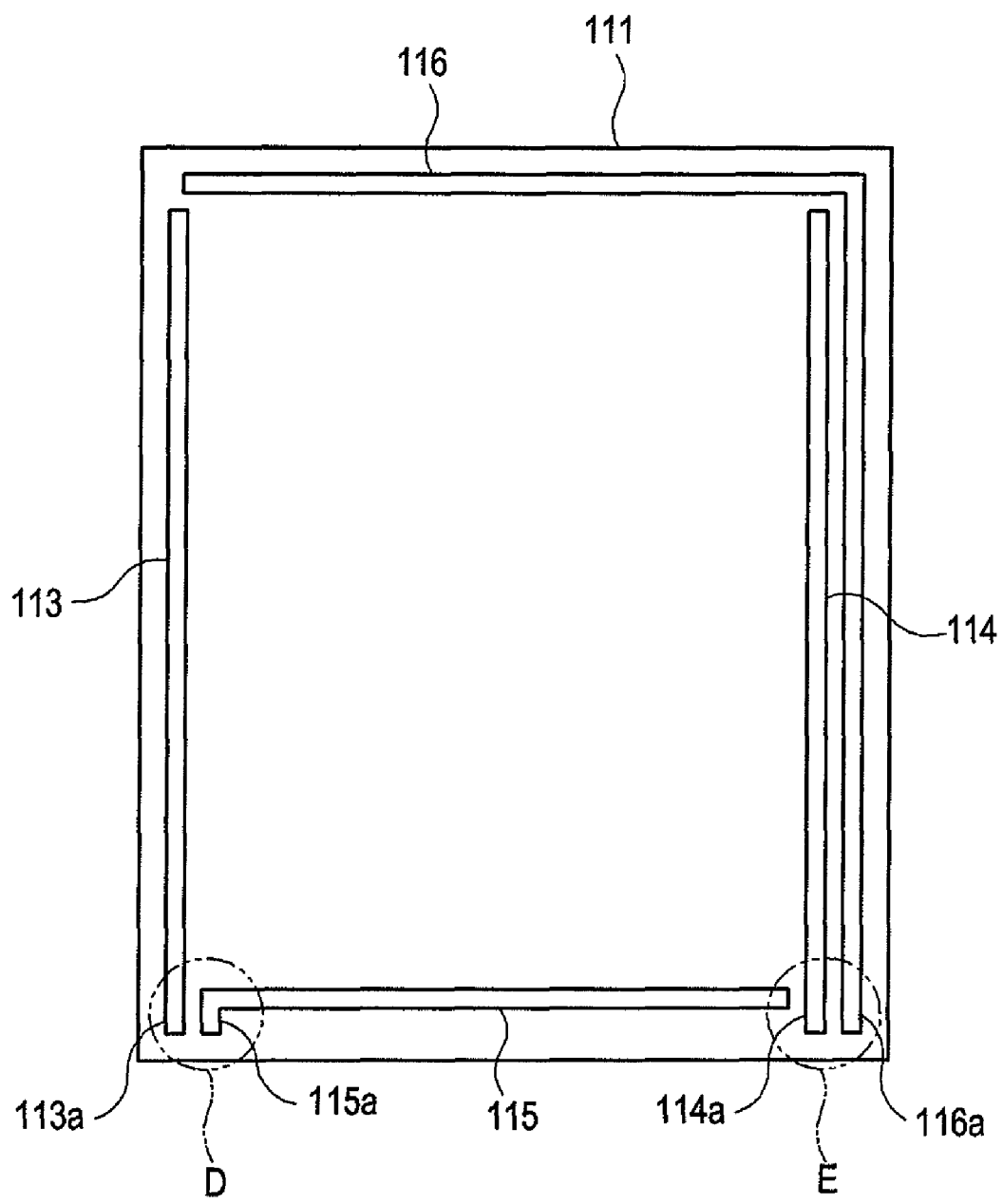
FIG. 10 is a plan view of a first substrate of the display device of FIG. 2, according to an exemplary embodiment of the present invention.

Referring to FIG. 10 and FIG. 6, the third pad 115a of the first connecting line 115 is connected with the third signal line 123, and is formed adjacent to the first pad 113a.

The second connecting line 116 is connected with the fourth signal line 124 and is elongated to extend along the second signal line 114 The fourth pad 116a is formed adjacent to the second pad 114a.

The first pad 113a and the third pad 115a are positioned on a first pad area D, which is positioned at a bottom left side of the first insulating substrate 111. The second pad 114a and the fourth pad 116a are positioned on a second pad area E, which is positioned at a bottom right side of the first insulating substrate 111.

The flexible circuit board 400 and the first substrate 110 are connected in the same way as the first substrate 110 of FIG. 5. The first flexible circuit board 400a is connected to the first pad 113a and the third pad 115a, and the second flexible circuit board 400b is connected to the second pad 114a and the fourth pad 116a.

Figure 11:
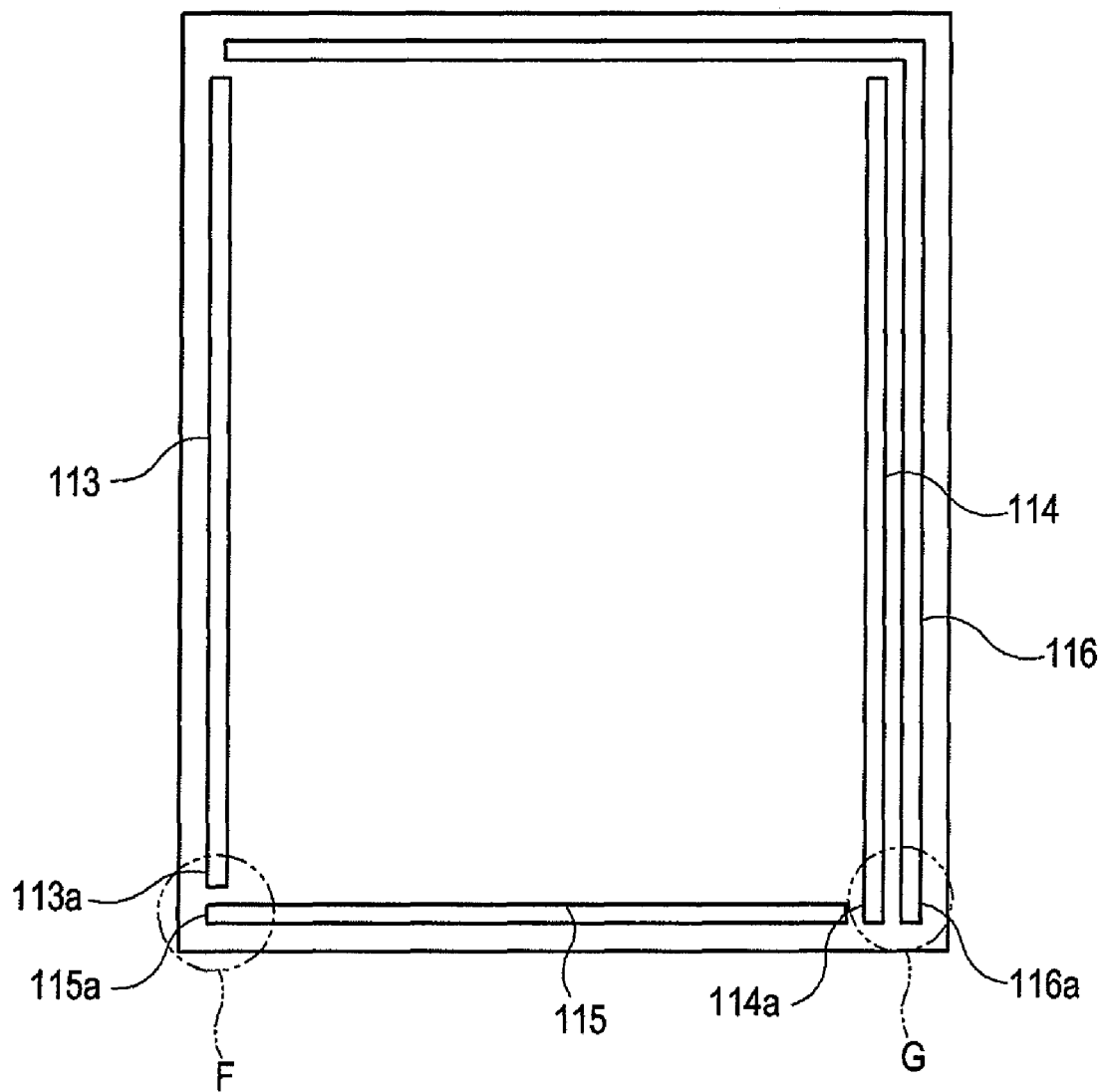
FIG. 11 is a plan view of a first substrate of the display device of FIG. 2, according to an exemplary embodiment of the present invention.

Referring to FIG. 11, the third pad 115a of the first connecting line 115 is connected with the third signal line 123 and formed adjacent to the first pad 113a.

Further, the first pad 113a and the third pad 115a are formed towards the longitudinal length of the first insulating substrate 111.

The second connecting line 116 is connected with the fourth signal line 124 and elongated to extend along the second signal line 114, and the fourth pad 116a is formed adjacent to the second pad 114a.

The first pad 113a and the third pad 115a are positioned on a first pad area F, which is positioned at a bottom left side of the first insulating substrate 111. The second pad 114a and the fourth pad 116a are positioned on a second pad area G, which is positioned at a bottom right side of the first insulating substrate 111.

Additionally, the flexible circuit boards 400a and 400b are connected with a different side of the first insulating substrate 111, respectively. The first flexible circuit board 400a, which is attached to a longitudinal side of the first insulating substrate 111, is connected with the first pad 113a and the third pad 115a, and the second flexible circuit board 400b, which is attached to a shorter side of the first insulating substrate 111, is connected with the second pad 114a and the fourth pad 116a.

A display device according to an exemplary embodiment of the present invention will be described with reference to FIGS. 12 through 18.

Figure 12:
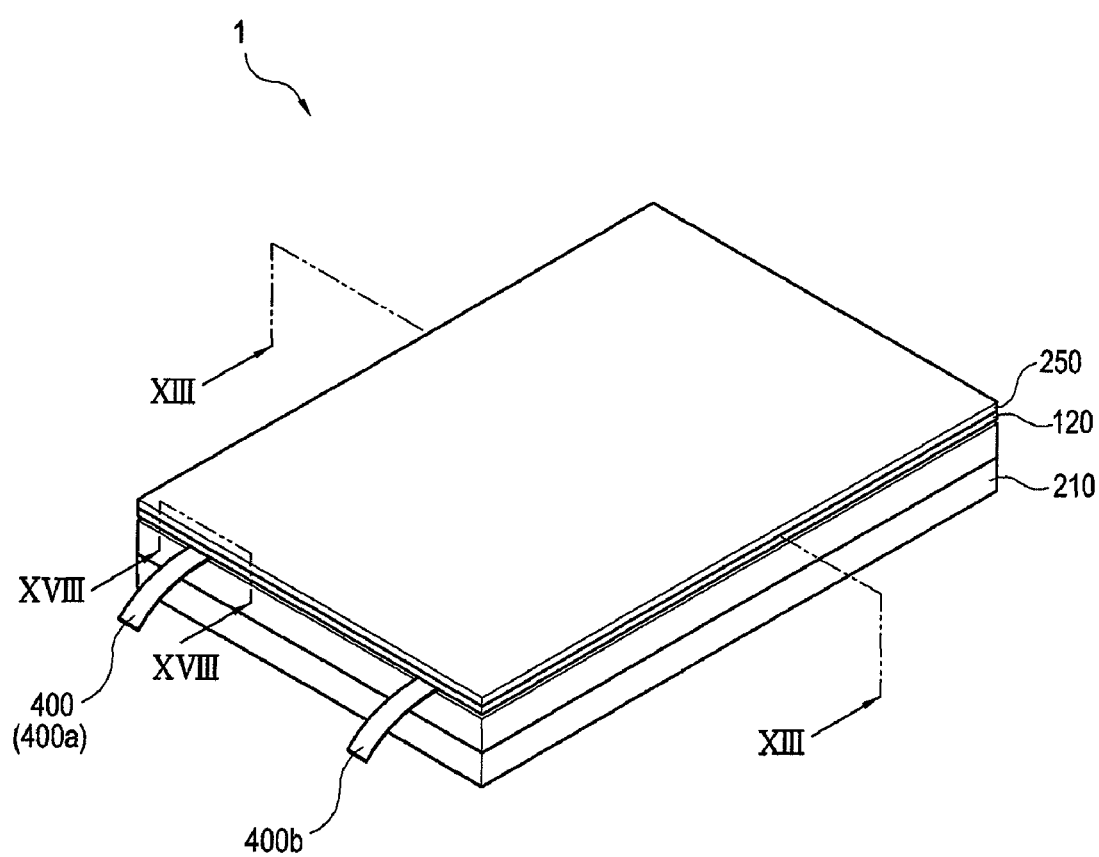
FIG. 12 is a perspective view of a display device according to an exemplary embodiment of the present invention.
Figure 13:
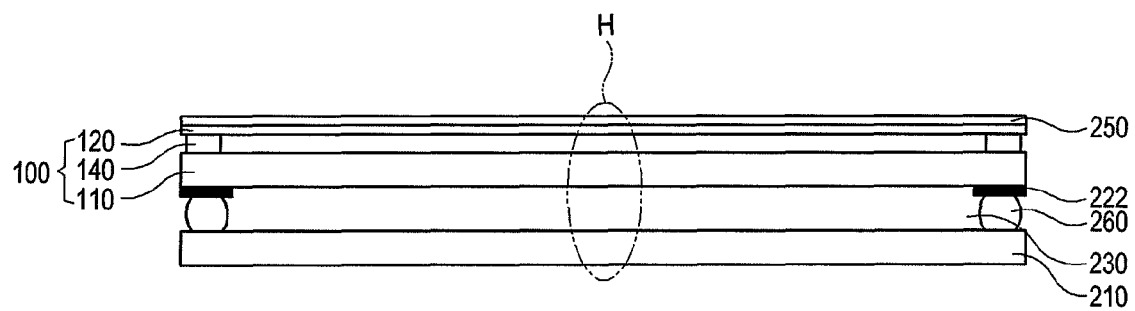
FIG. 13 is a cross sectional view, taken along line XIII-XIII of FIG. 12.
Figure 14:
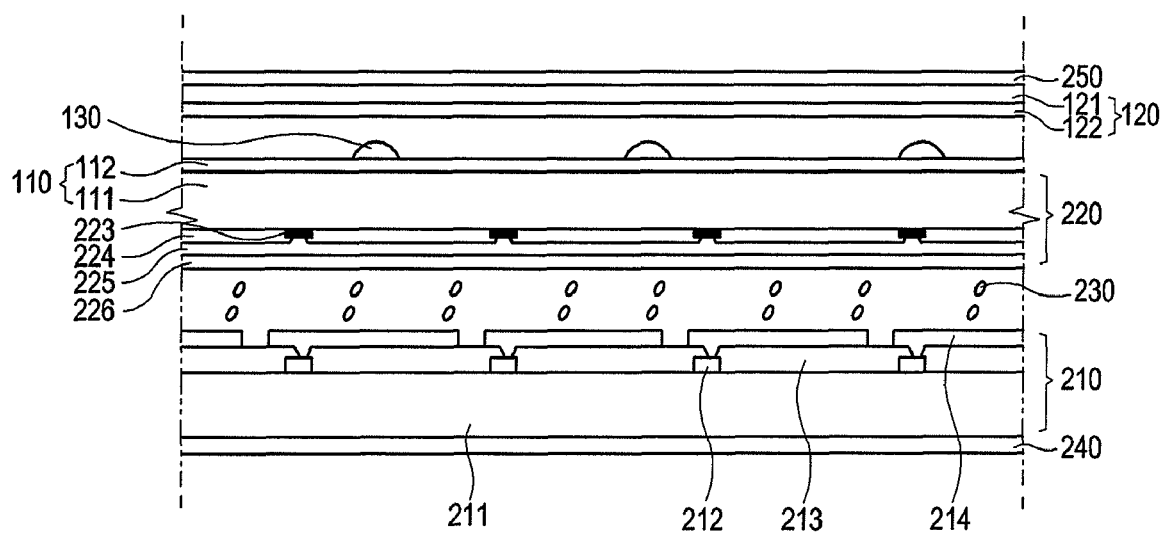
FIG. 14 is a magnified view of part H of FIG. 13.

Referring to FIGS. 12 through 14, the second liquid crystal panel substrate 220 of the liquid crystal panel 200 shares the first insulating substrate 111 with the first substrate 110 of the touch screen panel 100. The first resistance layer 112 is formed on an upper surface of the first insulating substrate 111. The black matrix 222, 223 and the color filter 224 are formed on the bottom of the first insulating substrate 111.

The second polarizing plate 250 of the liquid crystal panel 200 is formed on an upper surface of the touch screen panel 100.

According to at least one embodiment of the present invention, a width of the display device 1 can be shortened by reducing the use of insulating substrates. In addition, a weight of the display device 1 can be reduced and a product cost can be saved.

Figure 15:
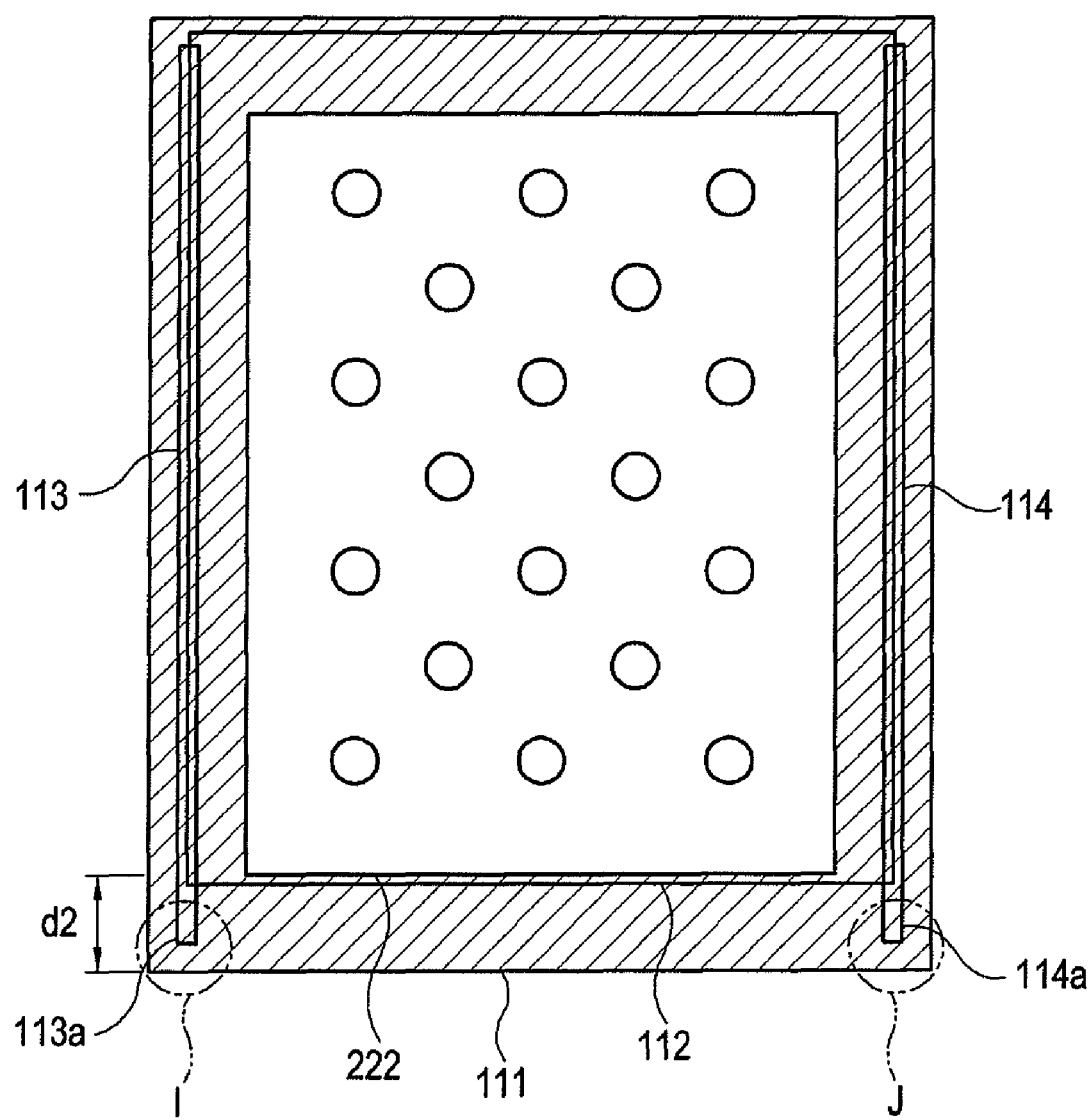
FIG. 15 is a plan view of a first substrate of the display device of FIG. 12, according to an exemplary embodiment of the present invention.

The first substrate 110 will be described with reference to FIGS. 14 and 15. The first substrate 110 includes a first insulating substrate 111, a first resistance layer 112 formed on the first insulating substrate 111, a first signal line 113, and a second signal line 114. In this embodiment, connecting lines are not formed on the first substrate 110.

The first resistance layer 112 is formed substantially over an upper surface of the first insulating substrate 111, and may be made of a transparent conductive material such as, for example, indium tin oxide (ITO) or indium zinc oxide (IZO).

The first signal line 113 and the second signal line 114 face each other across the first resistance layer 112 therebetween, and extend along a longitudinal length of the first insulating substrate 111. The first signal line 113 and the second signal line 114 are electrically connected with the first resistance layer 112, and may be made of metal.

An end portion of the first signal line 113, which is adjacent to the bottom side of the first insulating substrate 111, forms a first pad 113a, and an end portion of the second signal line 114, which is adjacent to the bottom side of the first insulating substrate 111, forms a second pad 114a.

Figure 16:
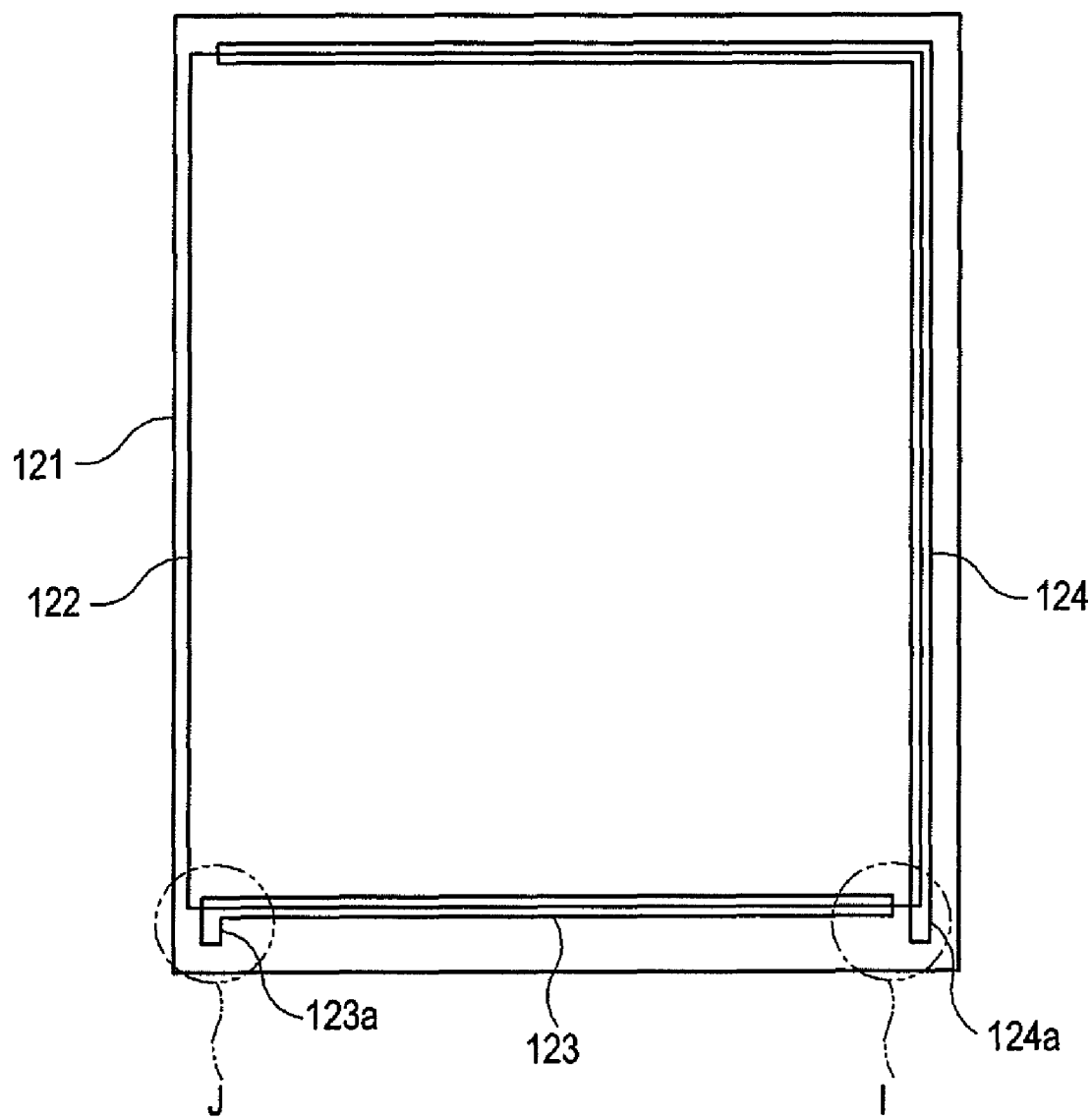
FIG. 16 is a plan view of a second substrate of the display device of FIG. 12, according to an exemplary embodiment of the present invention.

The second substrate 120 will be described with reference to FIGS. 14 and 16. The second substrate 120 includes the second insulating substrate 121, a second resistance layer 122, the third signal line 123, and the fourth signal line 124 formed on the second insulating substrate 121.

Since the second polarizing plate 250 is positioned on the upper surface of the second insulating substrate 121, the second insulating substrate 121 may be made of non-extending anisotropic polymer film, and may be substantially similar in size to the first insulating substrate 111.

Alternately, the second resistance layer 122 may be formed on the supporting layer of the second polarizing plate 250. When this occurs, the supporting layer forms the second insulating substrate 121.

The third signal line 123 is extended along a lower side of the second insulating substrate 121, and an end portion adjacent to a right side of the second insulating substrate 121 forms a third pad 123a.

The fourth signal line 124 is extended along an upper left side of the second insulating substrate 121, and an end portion adjacent to a lower side of the second insulating substrate 121 forms a fourth pad 124a.

The first pad 113a and the second pad 114a are formed on the first substrate 110, and the third pad 123a and the fourth pad 124a are formed on the second substrate 120.

The first pad 113a and the fourth pad 124a are positioned on a pad area I of a bottom left edge of the first insulating substrate 111 and arranged to face each other.

The second pad 114a and the third pad 123a are positioned on a pad area J of a bottom right edge of the first insulating substrate 111 and arranged to face each other.

Pairs of the pads 113a, 114a, 123a, and 124a are assembled together in both edges of the touch screen panel 100.

A connection between the pads 113a, 115a, 123a, and 124a and the flexible circuit board 400 will be described below with reference to FIGS. 17A through 17C and 18.

Figure 17A:
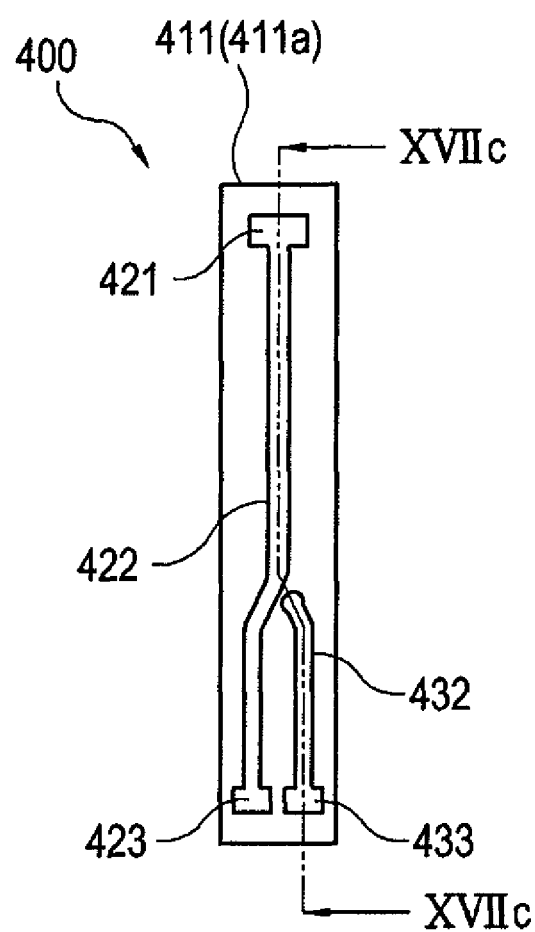
FIGS. 17A through 17C illustrate a flexible circuit board of a display device of FIG. 12, according to an exemplary embodiment of the present invention.
Figure 17B:
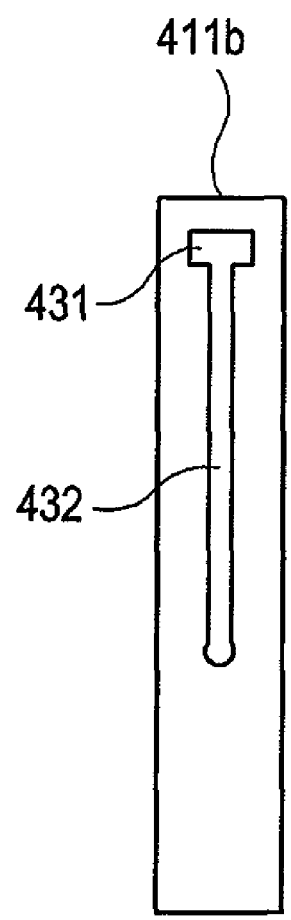
Figure 17C:
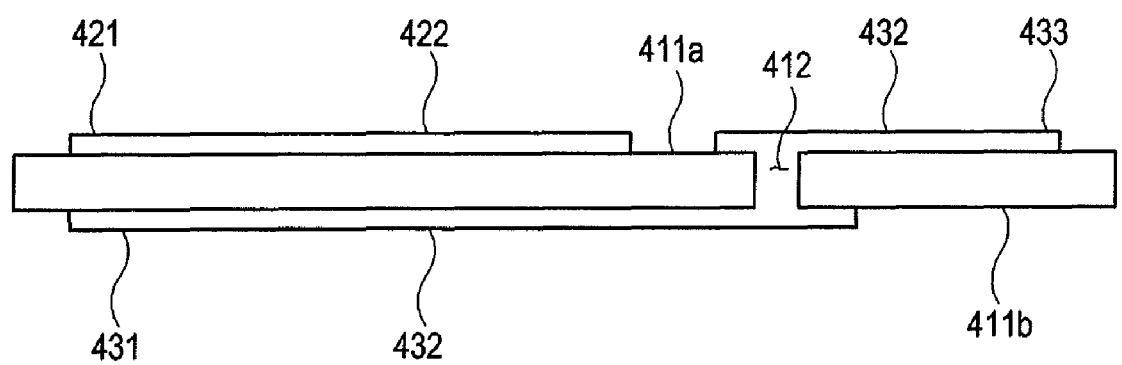

Referring to FIGS. 17A through 17C, the flexible circuit board 400 includes a flexible film 411, and a pair of connecting wires formed on the flexible film 411.

A first connecting wire includes an input lead 421, an output lead 423, and a lead connecting portion 422 connecting both the leads 421 and 423. A second connecting wire includes an input lead 431, an output lead 433, and a lead connecting portion 432 connecting both the leads 431 and 433.

The flexible circuit board 400 may be a double side flexible circuit board. The input lead 421, the output lead 423, the lead connecting portion 422, and the output lead 433 are formed on a first surface 411a of the flexible film 411, and the input lead 431 of the second connecting wire is formed on a second surface 411b of the flexible film 411.

A portion of the lead connecting portion 432 of the second connecting wire is connected to the output lead 433 and formed on the first surface 411a. Further, the other portion of the lead connecting portion 432 is connected to the input lead 431 and formed on the second surface 411b. The portions of the lead connecting portion 432 formed on different surfaces 411a and 411b are connected with each other through a via 412 formed on the flexible film 411.

Figure 18:
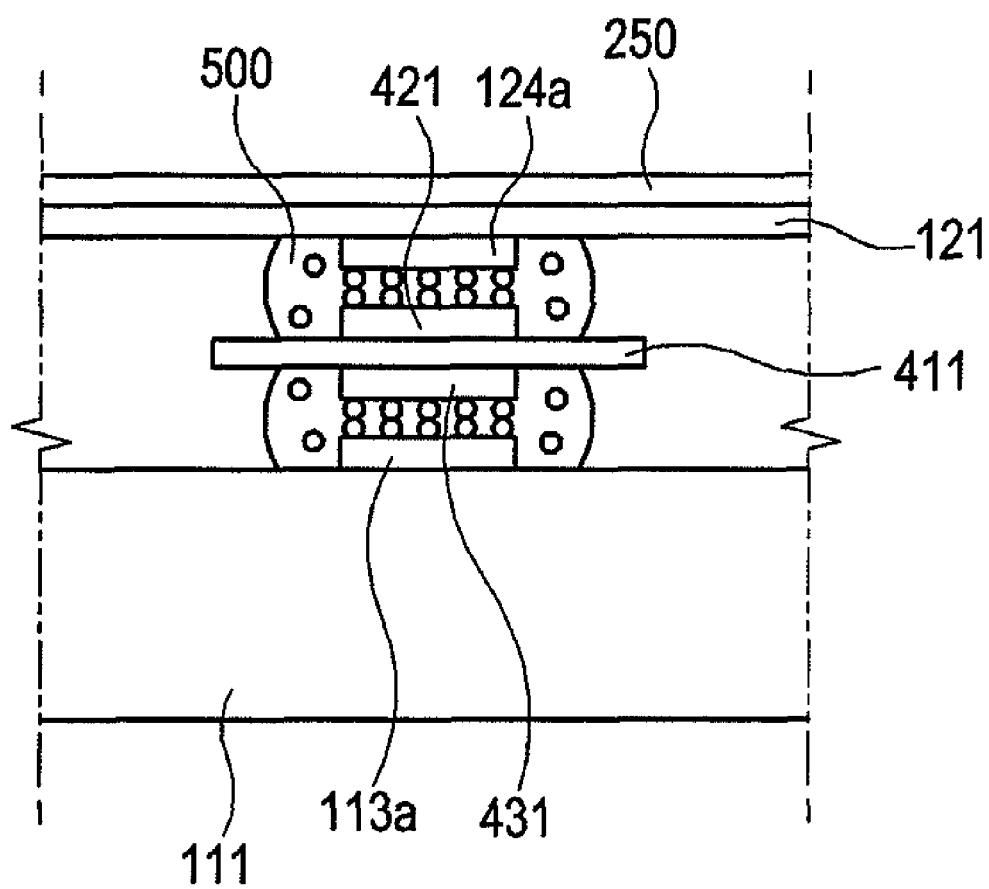
FIG. 18 is a cross sectional view, taken along line XVIII-XVIII of FIG. 12.

Referring to FIG. 18, the first pad 113a and the fourth pad 124a are connected to the first flexible circuit board 400a. The first pad 113a is electrically connected to the input lead 431 of the second connecting wire through an anisotropic conducting film 500, and the fourth pad 124a is electrically connected to the input lead 421 of the first connecting wire through the anisotropic conducting film 500.

The anisotropic conducting film 500 includes a base resin part 511 and conductive balls 512 scattered in the base resin part 511. The conductive balls 512 form an electrical channel by contacting with each other between the pads 113a and 124a and the input leads 421 and 431.

The second pad 114a and the third pad 123a are connected to the second flexible circuit board 400b in a manner similar to the way the first pad 113a and fourth pad 114a are connected to the first flexible circuit board 400a.

In FIG. 18, the liquid crystal panel 200 under the first insulating substrate 111 is not shown.

In each pad area I and J, pairs of the pads 113a and 123a, and 114 and 124a may be positioned to overlap in a perpendicular direction with each other, so that the required pad area is reduced, thereby reducing the size of the touch screen panel 100.

The pad areas I and J are positioned within the area of the black matrix 222. A width d2 of the black matrix 222 may be about 2 mm.

In addition, the arrangement of the signal lines 113, 114, 123, and 124 may be changed in a variety of ways.

Figure 19:
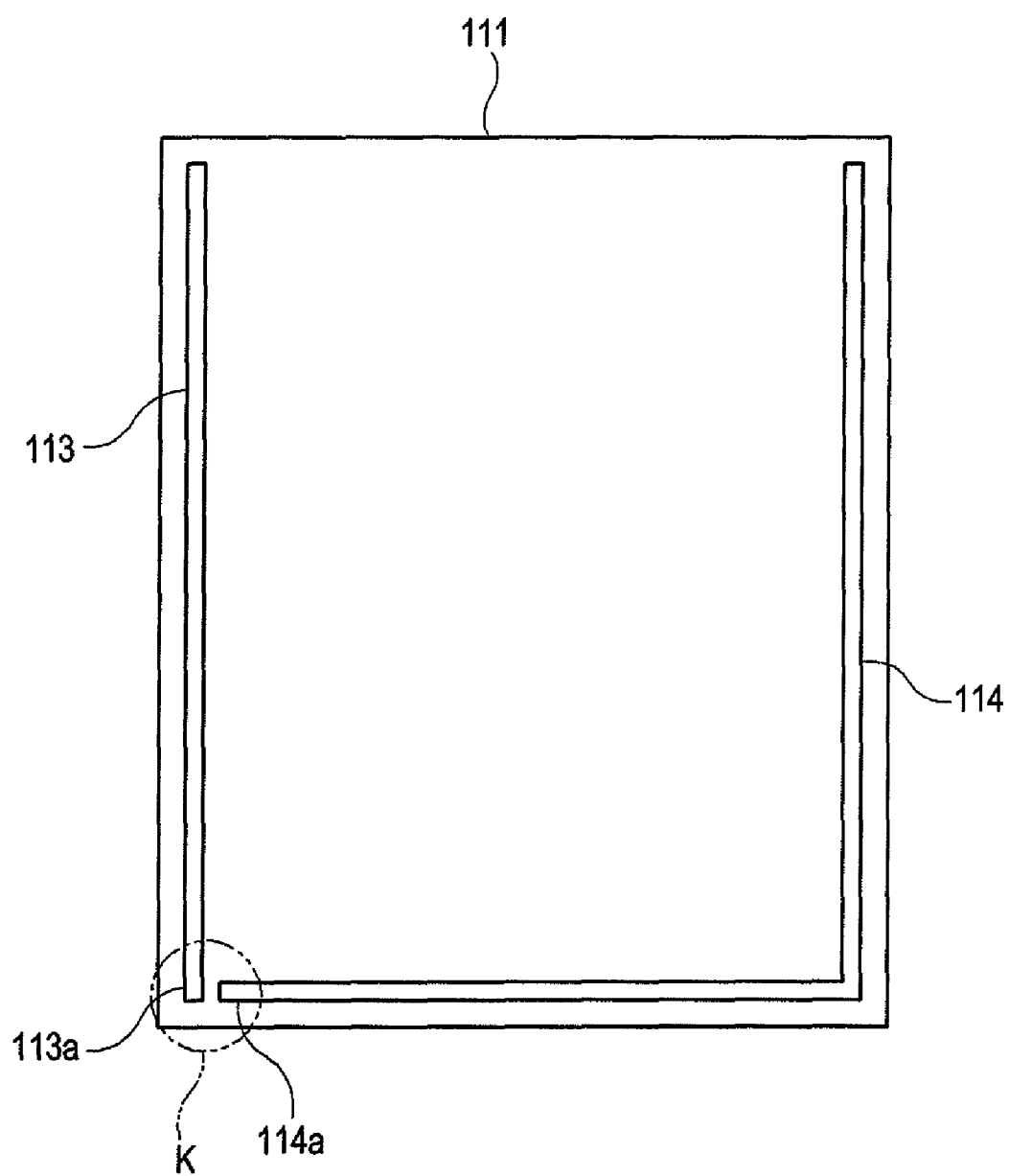
FIG. 19 is a plan view of a first substrate of the display device of FIG. 12, according to an exemplary embodiment of the present invention.

Referring to FIG. 19, the second signal line 114 is extended along a bottom side of the first insulating substrate 111, and has a second pad 114a, which is adjacent to the first pad 113a.

Figure 20:
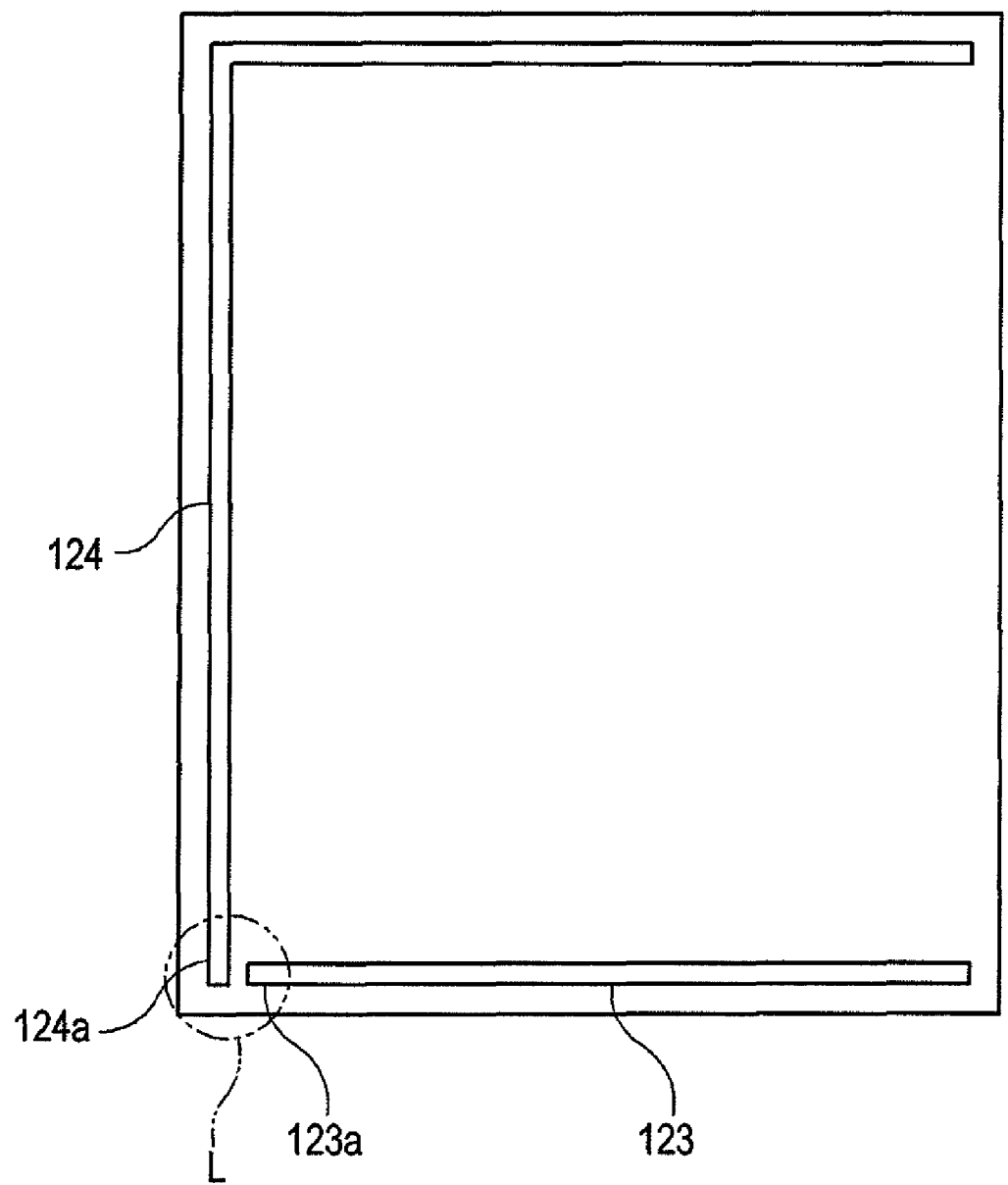
FIG. 20 is a plan view of a second substrate of the display device of FIG. 12.

Referring to FIG. 20, the fourth signal line 124 is extended along a left side of the second insulating substrate 121, and has a fourth pad 124a adjacent to the third pad 123a.

The pads 113a and 114a of the first substrate 110 are positioned in a pad area K. The pads 123a and 124a of the second substrate 120 are positioned in a pad area J.

According to the present embodiment, the flexible circuit board 400 is a single sided flexible circuit board. The first flexible circuit board 400a is attached to the first substrate 110 and connected to the first pad 113a and the second pad 114a, and the second flexible circuit board 400b is attached to the second substrate 120 and connected to the third pad 123a and the fourth pad 124a.

An exemplary embodiment of the present invention will be described with reference to FIGS. 21 through 25.

Figure 21:
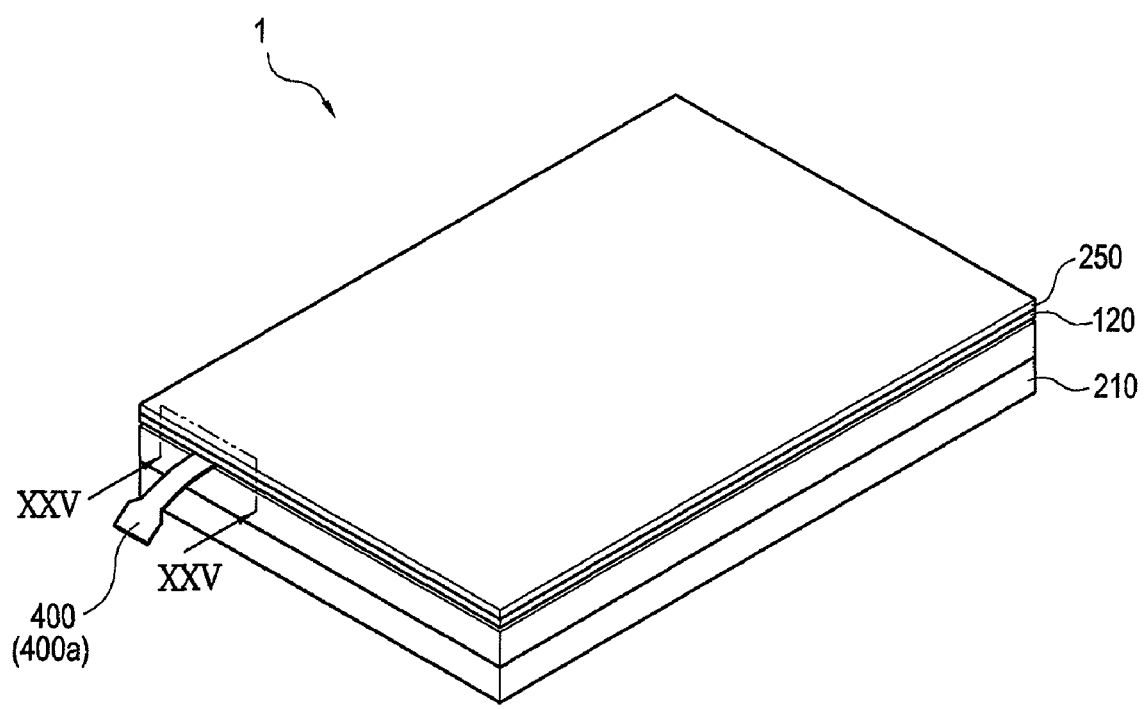
FIG. 21 is a perspective view of a display device according to an exemplary embodiment of the present invention.

Referring to FIG. 21, the flexible circuit board 400 is provided as a single sided flexible circuit board.

Figure 22:
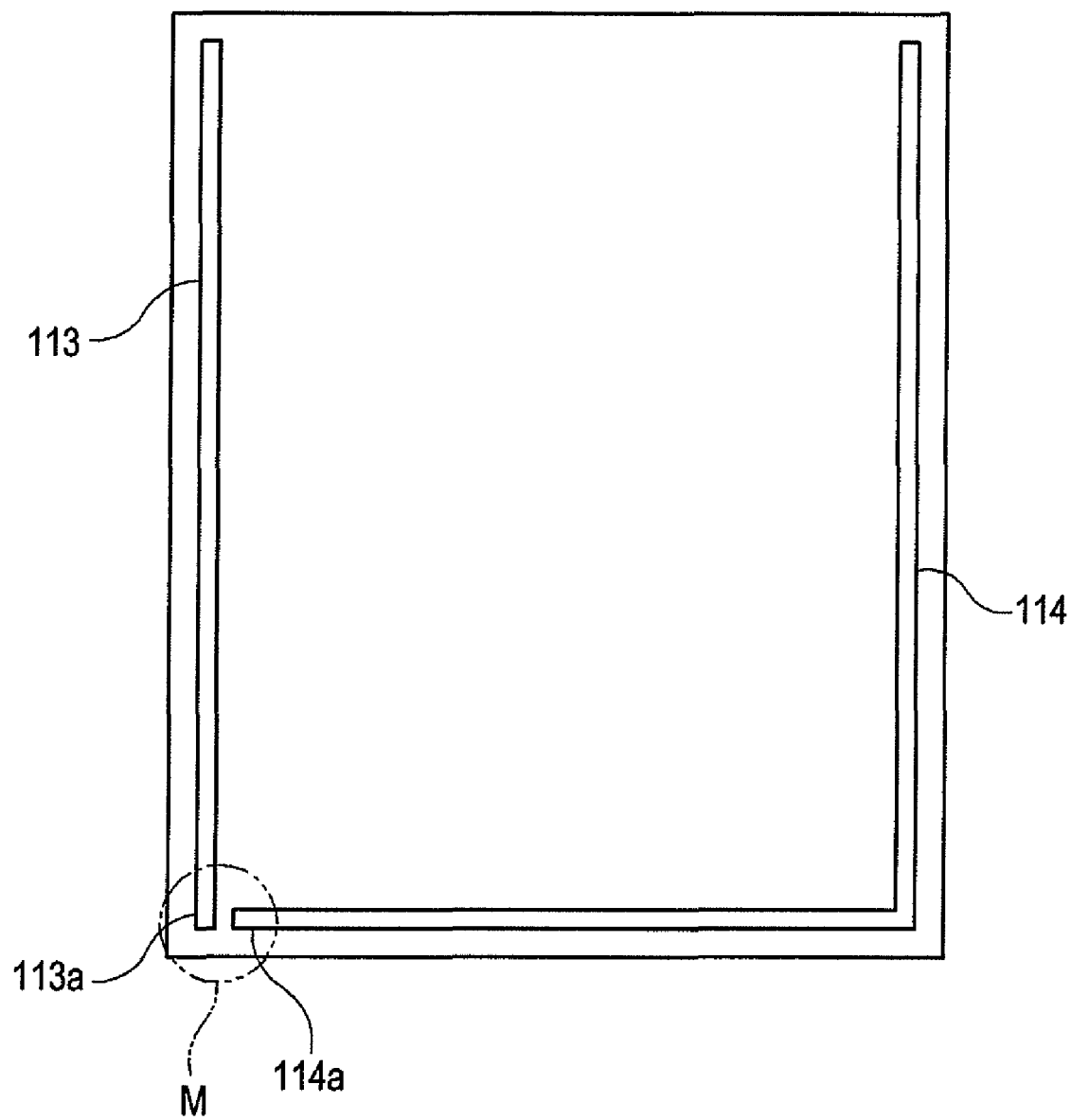
FIG. 22 is a plan view of a first substrate of the display device of FIG. 21, according to an exemplary embodiment of the present invention.
Figure 23:
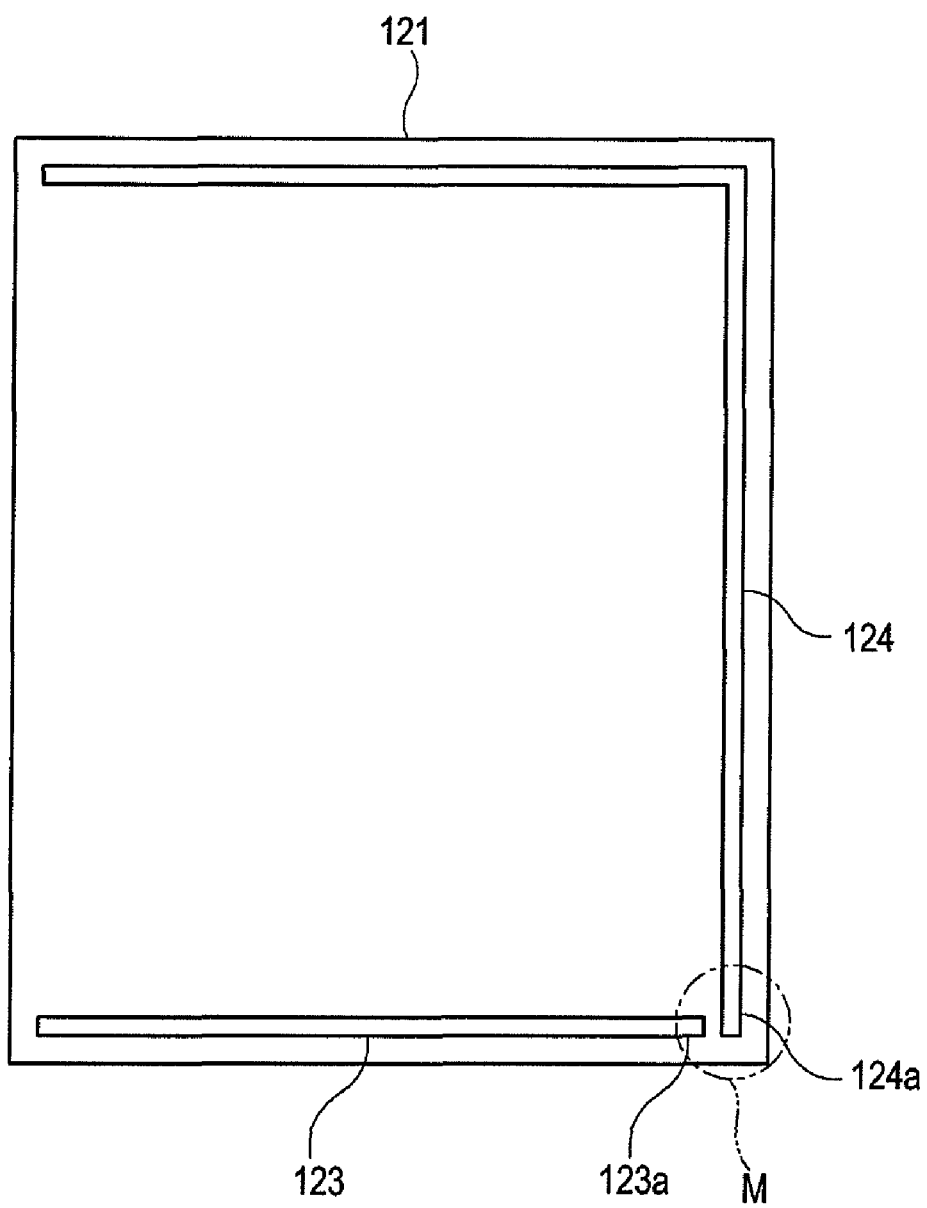
FIG. 23 is a plan view of a second substrate of the display device of FIG. 21, according to an exemplary embodiment of the present invention.

Referring to FIGS. 22 and 23, the pads 113a, 114a, 123a and 124a are adjacent to each other and the pads 113a and 114a of the first substrate 110 overlap with the pads 123a and 124a of the second substrate 120. A single pad area M is provided, and thus the flexible circuit board 400 may be provided as a single sided flexible circuit board.

Figure 24A:
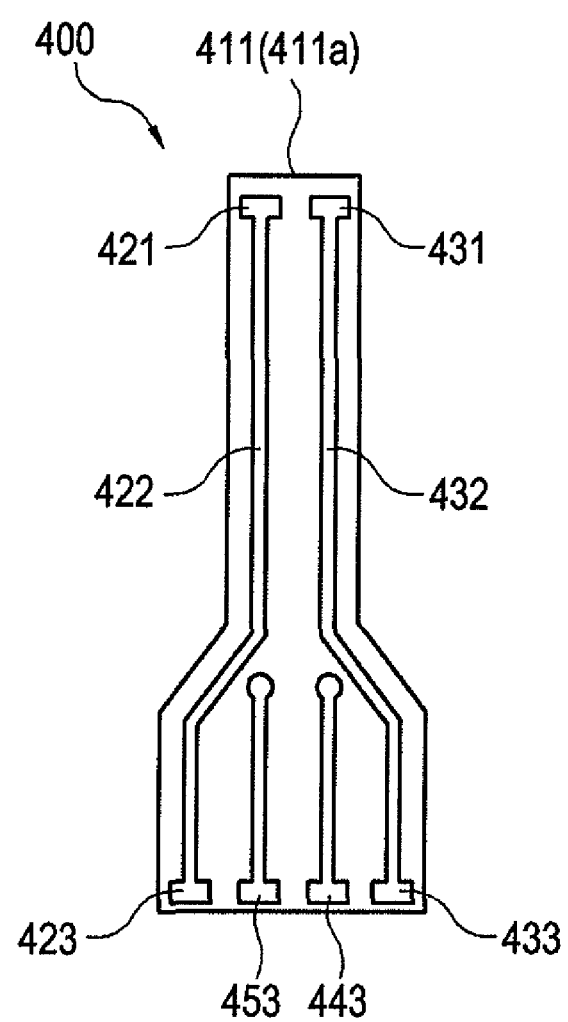
FIGS. 24A and 24B illustrate a flexible circuit board of the display device of FIG. 21, according to an exemplary embodiment of the present invention.
Figure 24B:
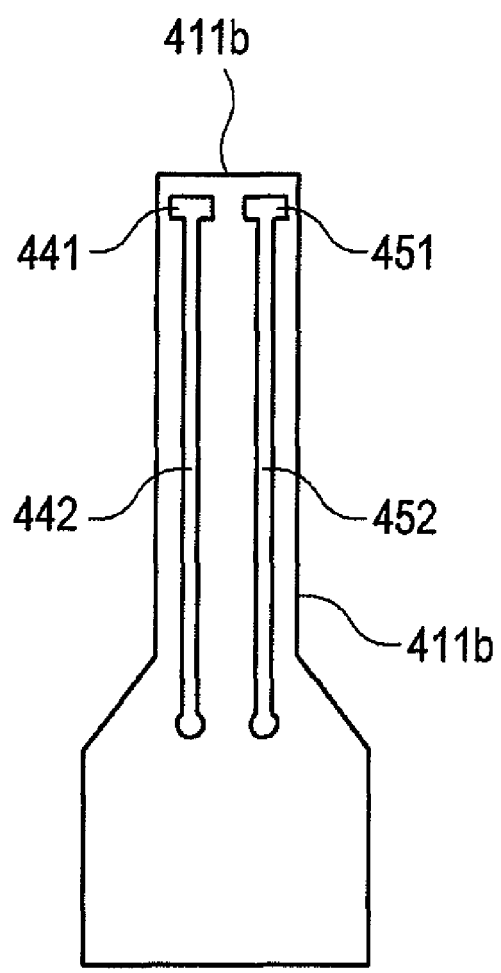

Referring to FIGS. 24A and 24B, the flexible circuit board 400 is a double sided circuit board and includes four connecting wires.

A first connecting wire includes an input lead 421, an output lead 423, and a lead connecting portion 422 connecting both the leads 421 and 423. A second connecting wire includes an input lead 431, an output lead 433, and a lead connecting portion 432 connecting both the leads 431 and 433. A third connecting wire includes an input lead 441, an output lead 443, and a lead connecting portion 442 connecting both the leads 441 and 443. A fourth connecting wire includes an input lead 451, an output lead 453, and a lead connecting portion 452 connecting both the leads 451 and 453.

The input lead 441 of the third connecting wire and the input lead 451 of the fourth connecting wire are positioned on a second surface 411b. A part of the lead connecting portion 442 of the third connecting wire and a part of the lead connecting portion 452 of the fourth connecting wire are positioned on the second surface 411b.

The lead connecting portions 422 and 432 positioned on the first surface 411a and the lead connecting portions 442 and 452 positioned on the second surface 411b are connected with each other through a via (not shown) formed on the flexible film 411.

Figure 25:
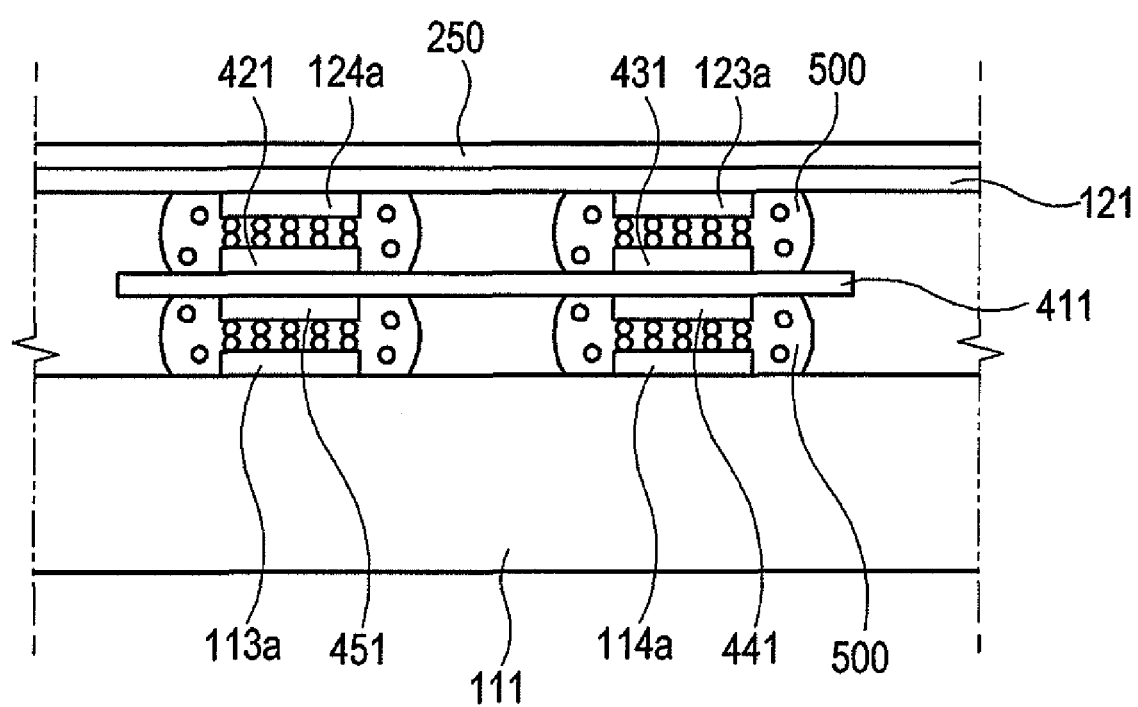
FIG. 25 is a cross sectional view, taken along line XXV-XXV of FIG. 21.

Referring to FIG. 25, the first pad 113a is electrically connected to the input lead 451 of the fourth connecting wire through an anisotropic conducting film 500, and the second pad 114a is electrically connected to the input lead 441 of the third connecting wire through the anisotropic conducting film 500.

Further, the third pad 123a is electrically connected to the input lead 431 of the second connecting wire, and the fourth pad 124a is electrically connected to the input lead 421 of the first connecting wire.

In FIG. 25, the liquid crystal panel 200 under the first insulating substrate 111 is not shown.

According to at least one embodiment of the present invention, the area for the pads decreases and the number of flexible circuit boards 400 decreases.

Double sided flexible circuit boards may be applied to the embodiments of the present invention where the touch screen panel 100 is separated from the liquid crystal panel 200.

In embodiments of the present invention, the position of the flexible circuit board 400 is not limited to an edge area of the touch screen panel 100. Further, the present invention may be applicable to a structure which includes five or more signal lines. When this occurs, the signal lines may be divided into a group of two signal lines and a group of three signal lines and then connected to the flexible circuit board. If the signal lines are more than five, three or more flexible circuit boards may be used.

Although the present invention has been described in connection with exemplary embodiments of the present invention, it will be apparent to those skilled in the art that many variations and modifications may be made thereto without substantially departing from the scope and spirit of the invention, the scope of which is defined in the appended claims and their equivalents.

What is claimed is:

1. A display device comprising:
a touch screen panel comprising a first substrate, wherein the first substrate comprises a first insulating substrate, a first resistance layer formed on the first insulating substrate, and first and second signal lines formed on the first insulating substrate;
a second substrate, wherein the second substrate faces the first substrate and the second substrate comprises a second insulating substrate, a second resistance layer formed on the second insulating substrate, and third and fourth signal lines formed on the second insulating substrate;
pads which comprise a first pad connected to the first signal line, a second pad connected to the second signal line, a third pad connected to the third signal line, and a fourth pad connected to the fourth signal line,
a first flexible circuit board connected to one of the pads formed on the first substrate and one of the pads formed on the second substrate; and
a second flexible circuit board connected to another one of the pads formed on the first substrate and another one of the pads formed on the second substrate,
wherein the first flexible circuit board is connected with the first substrate and the second substrate, and the second flexible circuit board is connected with the first substrate and the second substrate.

2. The display device according to claim 1, wherein the first flexible circuit board and the second flexible circuit board are connected to different corners of the first substrate, respectively.

3. The display device according to claim 1,
wherein the first and second pads are formed on the first substrate;
the third and fourth pads are formed on the second substrate; and
the first and second flexible circuit boards are provided as a double sided circuit board.

4. The display device according to claim 3, wherein the first flexible circuit board is connected to one of the first and second pads and to one of the third and fourth pads.

5. The display device according to claim 1, further comprising:
a liquid crystal panel substrate facing a rear surface of the first insulating substrate, and formed with a thin film transistor; and
a liquid crystal layer positioned between the first insulating substrate and the liquid crystal panel substrate.

6. The display device according to claim 5, further comprising a black matrix formed on the rear surface of the first insulating substrate, wherein the pads are positioned within an area of the black matrix.

7. The display device according to claim 5, further comprising:
a first polarizing plate positioned on a rear surface of the liquid crystal panel substrate; and
a second polarizing plate positioned on an upper surface of the liquid crystal panel substrate.

8. The display device according to claim 5, wherein the second insulating substrate comprises a polymer film.

9. A display device comprising:
a touch screen panel comprising a first substrate, wherein the first substrate comprises a first insulating substrate, a first resistance layer formed on the first insulating substrate, and a plurality of X signal lines formed on the first insulating substrate;
a second substrate, wherein the second substrate faces the first substrate and the second substrate comprises a second insulating substrate, a second resistance layer formed on the second insulating substrate, and a plurality of Y signal lines formed on the second insulating substrate;
pads which comprise a plurality of sub-pads electrically connected to one of the X signal lines and the Y signal lines, respectively;
a flexible circuit board which comprises a flexible film, and a first input lead formed on a first surface of the flexible film and corresponding to a first set of the sub-pads,
wherein the flexible circuit board is connected to one of the sub-pads formed on the first substrate and one of the sub-pads formed on the second substrate, and
wherein the flexible circuit board is connected with the first substrate and the second substrate.

10. The display device according to claim 9, wherein the flexible circuit board comprises a first flexible circuit board and a second flexible circuit board which are connected to different corners of the first substrate, respectively.

11. The display device according to claim 9, wherein the flexible circuit board comprises a second input lead formed on a second surface of the flexible film and corresponding to a second set of the sub-pads.

12. The display device according to claim 9, further comprising a liquid crystal panel substrate facing a rear surface of the first insulating substrate and formed with a thin film transistor; and a liquid crystal layer positioned between the first insulating substrate and the liquid crystal panel substrate.

13. The display device according to claim 12, further comprising a black matrix formed on the rear surface of the first insulating substrate, wherein the pads are positioned within an area of the black matrix.

14. The display device according to claim 12, further comprising:

a first polarizing plate positioned on a rear surface of the liquid crystal panel substrate; and a second polarizing plate positioned on an upper surface of the second insulating substrate.

* * * * *